United States Patent
Ariyama et al.

(10) Patent No.: US 7,444,612 B2
(45) Date of Patent: Oct. 28, 2008

(54) APPARATUS, METHOD AND PROGRAM FOR SUPPORTING DESIGNING OF INTEGRATED CIRCUIT USING A COMMON FORMAT

(75) Inventors: Masato Ariyama, Kawasaki (JP); Junko Taira, Kawasaki (JP); Kazuyuki Iida, Kawasaki (JP); Minoru Yabumoto, Kawasaki (JP); Tomohisa Suzuki, Kawasaki (JP); Minako Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 165 days.

(21) Appl. No.: 11/016,988

(22) Filed: Dec. 21, 2004

(65) Prior Publication Data
US 2006/0059447 A1   Mar. 16, 2006

(30) Foreign Application Priority Data
Sep. 10, 2004   (JP)   ............................. 2004-264282

(51) Int. Cl.
*G06F 17/50* (2006.01)
(52) U.S. Cl. .......................................... 716/15; 716/10
(58) Field of Classification Search ............... 716/8, 716/10–11, 15–17
See application file for complete search history.

(56) References Cited

U.S. PATENT DOCUMENTS 6,357,036 B1 * 3/2002 Eka et al. ...................... 716/15

2002/0188922 A1 * 12/2002 Ginneken et al. ............. 716/18

FOREIGN PATENT DOCUMENTS

| JP | 08-044782 | 2/1996 |
| JP | 10-154168 | 6/1998 |
| JP | 11-039356 | 2/1999 |
| JP | 11-110435 | 4/1999 |
| JP | 2002-117147 | 4/2002 |
| JP | 2002-230052 | 8/2002 |

OTHER PUBLICATIONS

Cadence, "OrCAD Capture, The industry standard in schematic design entry because of intuitive interface and rich feature set, Datasheet", 2003, obtained from http://www.supcad.cz/down/4419_ds_fnl.pdf. pp. 1-4.*
Xilinx, Phillippe Garrault, "(WP174 (v1.0) Methodologies for efficient FPGA integration into PCBs", Mar. 13, 2003. (hereinafter referred to as Xilinx). pags. 1-15. http://www.xilinx.com/bvdocs/whitepapers/wp174.pdf.*

* cited by examiner

*Primary Examiner*—Stacy A Whitmore
(74) *Attorney, Agent, or Firm*—Arent Fox LLP

(57) ABSTRACT

In designing integrated circuits such as FPGAs, a design support environment including the quality of design data is improved and the design efficiency is improved. An integrated-circuit design support apparatus that supports designing of an integrated circuit having a plurality of pins is provided. The apparatus includes a processor (a central processing unit) that forms a pin layout matrix (a matrix sheet) by unifying pin layout information of the integrated circuit using a common format and arranging the pin layout information in coordinates. The processor creates an integrated-circuit design library from the pin layout matrix.

16 Claims, 24 Drawing Sheets

FIG.6

| NO. | ITEM NAME | UNIT | ITEM EXAMPLE | CORRESPONDING ITEM | REMARKS |
|---|---|---|---|---|---|
| 1 | PIN NUMBER | | A1<br>AA13 | VENDER PIN NAME | THE PHYSICAL PIN NAME OF CN VERSION IS THE SAME AS THE VENDER PIN NAME, AND THE DIGITS MAY BE ADJUSTED BY FILLING "0".<br>THE PHYSICAL PIN NAME OF TN VERSION IS AVAILABLE FROM A "VENDER PIN NAME RELATION TABLE". |
| 2 | SIGNAL NAME | | RST<br>CHDEMO0 BUS <12> | LOGIC PIN NAME OF SIGNAL PIN | WHEN THE NUMBER OF CHARACTERS IS LARGE, REDUCTION IS NECESSARY CONSIDERING THE SYMBOL SHAPE. |
| 3 | PIN USAGE | | IOB<br>GCLKIOB | — | |
| 4 | PIN NAME | | GND<br>GCK2<br>NC<br>IO_VREF_1<br>VCCO1<br>VCCINT | LOGIC PIN NAME OTHER THAN SIGNAL NAME | |
| 5 | DIRECTION | | UNUSED<br>INPUT<br>OUTPUT | PIN INPUT/OUTPUT CATEGORY | |
| 6 | IO STANDARD | | LVTTL | TECHNOLOGY | |
| 7 | IO BANK | | 0<br>1 | BANK NUMBER | |
| 8 | DRIVE | mA | 12 | IoL | |
| 9 | SLEW RATE | | SLOW | | |
| 10 | PULLUP PULLDOWN | | NONE** | | |
| 11 | IOB DELAY | | NONE<br>IFD | | |
| 12 | VOLTAGE | V | na<br>2.5<br>3.30 | VOLTAGE VALUE | |
| 13 | CONSTRAINT | | | | |

FIG.7

| NO. | ITEM NAME | UNIT | ITEM EXAMPLE | CORRESPONDING ITEM | REMARKS |
|---|---|---|---|---|---|
| 1 | PIN NAME/USAGE | | VCC_INT<br>VCC_IO<br>GND<br>GND*<br>GND+<br>IOP_DI_BUS [5]<br>CHA0_D0_TAG [0]<br>nCEO<br>nCE<br>RST<br>TDI | LOGIC PIN NAME | WHEN THE NUMBER OF CHARACTERS IS LARGE, REDUCTION IS NECESSARY CONSIDERING THE SYMBOL SHAPE. |
| 2 | LOCATION | | A1<br>AA13 | VENDER PIN NAME | THE PHYSICAL PIN NAME OF CN VERSION IS THE SAME AS THE VENDER PIN NAME, AND THE DIGITS MAY BE ADJUSTED BY FILLING "0". THE PHYSICAL PIN NAME OF TN VERSION IS AVAILABLE FROM A "VENDER PIN NAME RELATION TABLE". |
| 3 | DIRECTION | | INPUT<br>OUTPUT | PIN INPUT/OUTPUT CATEGORY | |
| 4 | IO STANDARD | | LVTTL | TECHNOLOGY | |
| 5 | VOLTAGE | | 1.8V<br>3.3V | VOLTAGE VALUE | |

FIG.10

| NO. | FPGA DESIGN SUPPORT PROGRAM | | A | | B | |
|---|---|---|---|---|---|---|
| | ITEM NAME | UNIT | ITEM NAME | UNIT | ITEM NAME | UNIT |
| 1 | PHYSICAL PIN NAME | | NA | | NA | |
| 2 | VENDER PIN NAME | | PIN NUMBER | | LOCATION | |
| 3 | LOGIC PIN NAME | | SIGNAL NAME PIN NAME | | PIN NAME/USAGE | |
| 4 | PIN INPUT/OUTPUT CATEGORY | | DIRECTION PIN NAME VOLTAGE | | DIRECTION PIN NAME/USAGE VOLTAGE | |
| 5 | TECHNOLOGY | | IO STANDARD | | IO STANDARD | |
| 6 | BANK NUMBER | | IO BANK | | NA | |
| 7 | DC CHARACTERISTIC (IiL/IoL) | µA | DRIVE | mA | NA | |
| 8 | POWER-SUPPLY VOLTAGE | mV | VOLTAGE | V | VOLTAGE | V |
| 9 | OPEN AVAILABILITY | | DIRECTION | | DIRECTION | |
| 10 | PHYSICAL PIN NAME OF CORRESPONDING PAIR PIN | | NA | | NA | |

FIG.11

| COMPONENT NAME | PIN NAME | LOGIC PIN NAME | | INPUT/OUTPUT CATEGORY | | DC CHARACTERISTIC [μA] | | INTERFACE CODE | | PIN CODE | | POWER-SUPPLY VOLTAGE [mA] | | OPEN | | PAIR PIN NAME | | BANK NO. | |
|---|---|---|---|---|---|---|---|---|---|---|---|---|---|---|---|---|---|---|---|
| | | OLD | NEW | OLD | NEW | OLD | NEW | OLD | NEW | OLD | NEW | OLD | NEW | OLD | NEW | OLD | NEW | OLD | NEW |
| 15 | 20 | CHA_BUS[0] | IOP_BUS[0] | INPUT | OUTPUT | — | 8000 | K3 | K3 | — | — | — | — | NA | OK | — | — | 5 | 7 |
| | 21 | CHA_BUS[1] | IOP_BUS[1] | INPUT | OUTPUT | — | 8000 | K3 | K3 | — | — | — | — | NA | OK | — | — | 5 | 7 |
| | 24 | VCCO | VCCO | POWER SUPPLY | POWER SUPPLY | — | — | — | — | — | — | 3300 | 2500 | NA | NA | — | — | 5 | 7 |
| | 30 | IOP_BUS[0] | CHA_BUS[0] | OUTPUT | INPUT | 8000 | — | K3 | K3 | — | — | — | — | OK | NA | — | — | 7 | 5 |
| | 31 | IOP_BUS[1] | CHA_BUS[1] | OUTPUT | INPUT | 8000 | — | K3 | K3 | — | — | — | — | OK | NA | — | — | 7 | 5 |
| | 34 | VCCO | VCCO | POWER SUPPLY | POWER SUPPLY | — | — | — | — | — | — | 2500 | 3300 | NA | NA | — | — | 7 | 5 |

FIG.12A

| DATE | TIME | USER | CHANGE SOURCE | DETAILS |
|---|---|---|---|---|
| 200*/2/24 | 15:00:00 | AAAAAA | PARTS_FPGA_UNIT_I5.plib | REFERENCE |
| 200*/2/25 | 10:00:00 | AAAAAA | PARTS_FPGA_UNIT_I10.pli | REFERENCE |

FIG.12B

| COMPONENT NAME | PIN NAME | LOGIC PIN NAME | | INPUT/OUTPUT CATEGORY | | DC CHARACTERISTIC [μA] | | INTERFACE CODE | | PIN CODE | | POWER-SUPPLY VOLTAGE [mA] | | OPEN | | PAIR PIN NAME | | BANK NO. | |
|---|---|---|---|---|---|---|---|---|---|---|---|---|---|---|---|---|---|---|---|
| | | OLD | NEW | OLD | NEW | OLD | NEW | OLD | NEW | OLD | NEW | OLD | NEW | OLD | NEW | OLD | NEW | OLD | NEW |
| 15 | 20 | CHA_BUS[0] | IOP_BUS[0] | INPUT | OUTPUT | — | 8000 | K3 | K3 | — | — | — | — | NA | OK | — | — | 5 | 7 |
| | 21 | CHA_BUS[1] | IOP_BUS[1] | INPUT | OUTPUT | — | 8000 | K3 | K3 | — | — | — | — | NA | OK | — | — | 5 | 7 |
| | 24 | VCCO | VCCO | POWER SUPPLY | POWER SUPPLY | — | — | — | — | — | — | 3300 | 2500 | NA | NA | — | — | 5 | 7 |
| | 30 | IOP_BUS[0] | CHA_BUS[0] | OUTPUT | INPUT | 8000 | — | K3 | K3 | — | — | — | — | OK | NA | — | — | 7 | 5 |
| | 31 | IOP_BUS[1] | CHA_BUS[1] | OUTPUT | INPUT | 8000 | — | K3 | K3 | — | — | — | — | OK | NA | — | — | 7 | 5 |
| | 34 | VCCO | VCCO | POWER SUPPLY | POWER SUPPLY | — | — | — | — | — | — | 2500 | 3300 | NA | NA | — | — | 7 | 5 |

FIG.13

| NET NAME | COMPONENT NAME | OLD PIN NAME | NEW PIN NAME |
|---|---|---|---|
| +2.5V1 | 15 | 34 | 24 |
| +3.3V1 | 15 | 24 | 34 |
| CHA_BUS[0] | 15 | 20 | 30 |
| CHA_BUS[1] | 15 | 21 | 31 |
| IOP_BUS[0] | 15 | 30 | 20 |
| IOP_BUS[1] | 15 | 31 | 21 |

(A)

| DATE | TIME | USER | CHANGE SOURCE | DETAILS |
|---|---|---|---|---|
| 200*/2/19 | 15:00:00 | AAAAAA | TA21999.fpgaba | REFERENCE |

(B)

| NET NAME | COMPONENT NAME | OLD PIN NAME | NEW PIN NAME |
|---|---|---|---|
| +2.5V1 | 15 | 34 | 24 |
| +3.3V1 | 15 | 24 | 34 |
| CHA_BUS[0] | 15 | 20 | 30 |
| CHA_BUS[1] | 15 | 21 | 31 |
| IOP_BUS[0] | 15 | 30 | 20 |
| IOP_BUS[1] | 15 | 31 | 21 |

FIG.15

| COMPONENT NAME | PIN NAME | LOGIC PIN NAME | | INPUT/OUTPUT CATEGORY | | DC CHARACTERISTIC [µA] | | INTERFACE CODE | | PIN CODE | | POWER-SUPPLY VOLTAGE (mA) | | OPEN | | PAIR PIN NAME | | BANK NO. | |
|---|---|---|---|---|---|---|---|---|---|---|---|---|---|---|---|---|---|---|---|
| | | OLD | NEW | OLD | NEW | OLD | NEW | OLD | NEW | OLD | NEW | OLD | NEW | OLD | NEW | OLD | NEW | OLD | NEW |
| 110 | 20 | CHA_BUS[0] | 2IOP_BUS[0] | INPUT | OUTPUT | — | 8000 | K3 | K3 | — | — | — | — | NA | OK | — | — | 5 | 7 |
| | 21 | CHA_BUS[1] | 2IOP_BUS[1] | INPUT | OUTPUT | — | 8000 | K3 | K3 | — | — | — | — | NA | OK | — | — | 5 | 7 |
| | 24 | VCCO | VCCO | POWER SUPPLY | POWER SUPPLY | — | — | — | — | — | — | 3300 | 2500 | NA | NA | — | — | 5 | 7 |
| | 30 | 2IOP_BUS[0] | CHA_BUS[0] | OUTPUT | INPUT | 8000 | — | K3 | K3 | — | — | — | — | OK | NA | — | — | 7 | 5 |
| | 31 | 2IOP_BUS[1] | CHA_BUS[1] | OUTPUT | INPUT | 8000 | — | K3 | K3 | — | — | — | — | OK | NA | — | — | 7 | 5 |
| | 34 | VCCO | VCCO | POWER SUPPLY | POWER SUPPLY | — | — | — | — | — | — | 2500 | 3300 | NA | NA | — | — | 7 | 5 |

FIG.22

| EP20K1000E I/O PIN-OUTS I/O & VREF BAN | PAD NUMBER ORIENTATION | EP20K1000E I/O PIN-OUTS | 652-PIN BGA | 652-PIN FINE LINE BGA | 1,020-Pin FINE LINE BGA |
|---|---|---|---|---|---|
| 1 | 1 | I/O | – | C6 | C5 |
| 1 | 2 | I/O | – | B5 | D5 |
|  | 3 | VCCINT | VCCINT | VCCINT | VCCINT |
|  | 4 | GNDINT | GND | GND | GND |
| 1 | 5 | I/O | – | A5 | E4 |

FIG.24

| PIN LOCATION(EP20K1000EBC652-1X[TA46007-2190G6]) | | | FPGA SIGNAL NAME | EDB SIGNAL NAME | DIRECTION | ATTRIBUTE | CONTENT | REMARK |
|---|---|---|---|---|---|---|---|---|
| PIN No.(BGA) | PIN NAME | BANK | PIN No.(SYMBOL) | | | | | |
| A1 | GND | — | 1 | GND | | | | |
| B1 | GND | — | 2 | GND | | | | |
| C1 | I/O | 8 | 3 | I/O | | | | |
| D1 | I/O | 8 | 4 | I/O | | | | |
| E1 | I/O | 8 | 5 | I/O | | | | |
| F1 | I/O | 8 | 6 | I/O | | | | |
| G1 | I/O | — | 7 | I/O | | | | |
| H1 | VCCINT | 8 | 8 | VCCINT | | | | |
| J1 | I/O | 8 | 9 | I/O | | | | |
| K1 | I/O | 8 | 10 | I/O | | | | |
| L1 | I/O | 8 | 11 | I/O | | | | |
| M1 | I/O, nWS | 8 | 12 | I/O, nWS | | | | |

APPARATUS, METHOD AND PROGRAM FOR SUPPORTING DESIGNING OF INTEGRATED CIRCUIT USING A COMMON FORMAT

BACKGROUND OF THE INVENTION

1. Field of the Invention

The present invention relates to design support of integrated circuits, such as FPGAs (field programmable gate arrays), and more particularly, to an integrated circuit design support apparatus having an interface environment for designing integrated circuits such as FPGAs, an integrated circuit design support method, an integrated circuit design support program, and a recording medium.

2. Description of the Related Art

As is well known, FPGAs are integrated circuits to which circuit information within a device can be electrically written by a program externally provided and achieve predetermined circuit functions based on the circuit information. Because of their abilities of reducing process steps, facilitating processes from design to manufacture, and externally changing logics, products designed based on FPGAs are becoming the mainstream in the current circuit design. The designing of FPGAs involve processes, such as management of data regarding the FPGAs and creation of libraries, and the created libraries must be compared with pin names in logic design.

In connection with such design support technology for FPGAs, Japanese Unexamined Patent Application Publication No. 11-110435 discloses a design support system. This design support system uses auxiliary data to which reference is made for the data processing, in addition to design data that are inputs and outputs for data processing included in the design flow. The design support system performs processing using a data process selection table in which design data and auxiliary data are associated for each data processing and are shown in a multilevel hierarchy.

Japanese Unexamined Patent Application Publication No. 8-44782 discloses a design data management apparatus. This management apparatus creates information on a reference/dependence relationship between a library and design data in accordance with contents of library items and uses the information to achieve coherence with the design data, thereby reducing an unwanted operation for retaining the coherence. From input change information, the design data management apparatus extracts a reference design-data identifier that directly refers to the changed item, and selects and outputs the identifier of design data to be updated, based on the reference design-data identifier and the changed information.

Japanese Unexamined Patent Application Publication No. 2002-230052 discloses a CAD (computer aided design) data creation method that can provide a CAD data file or a print screen for small-scale to large-scale design structures. The CAD data file creation method involves processing for converting the file format of design data created by spreadsheet software into another specific file format.

Further, Japanese Unexamined Patent Application Publication No. 2002-117147 discloses a coordinated system that can eliminate complimentary processing, such as information use-limitation and re-entry, that results from different specifications of information in computer databases at an application software level. This coordinated system includes processing for causing an extraction program to extract necessary data from a database, processing for inputting the extracted data to a recording medium or the like, and executing input of the extracted data to a recording medium or the like by using a CSV (comma separated value) compliant format.

Japanese Unexamined Patent Application Publication No. 10-154168 discloses a component automatic registration apparatus and method. In this technology, component catalog data and design specifications are standardized and compiled into a database, data entry is simplified to accomplish labor-saving in creation of a component library, and a CAD system is used to improve work efficiency in printed-circuit-board design. In such a registration apparatus and method, component automatic generator software automatically creates the component library based on various data, such as component outer-shape data, as data regarding a component mounted to a substrate corresponding to an input specification on a component library creation process.

In response to frequent design changes, Japanese Unexamined Patent Application Publication No. 11-39356 discloses a design data management method and an apparatus therefor that maintains coherence of design data, extracts change difference data, stores change history data, and soon. In order to associate data used by various applications in the system, when a data change occurs, the design data management method and the apparatus therefor include processing, such as checking data coherence, extracting difference data before and after change, and storing the change difference data. Further, data managed by designers/engineers and designing/engineering departments that are connected through a network are shared to achieve coordinated design-work environment.

For designing FPGAs, large-scale FPGAs are increasingly used as alternatives to conventional ASICs (application specified ICs) and the number of pins currently ranges from 500 to 1500. Due to the large number of pins, lead-time mistakes and design load have increased. Especially, for the data management, since the formats of pin layout materials are not unified and no link is available between the design data, it is difficult to manage the data. For library creation, it takes time to create a library of symbols of the FPGA with the large number of pins and the created library requires time-consuming comparison with pin names in logic design. Further, for feedback of a change, a large number of work hours is required to feed back a mount requirement and a pin layout change due to logic modification to the library, circuit, and mount process. Neither such problems associated with FPGA design nor means for solving the problems are not disclosed or suggested in Japanese Unexamined Patent Application Publication Nos. 11-110435, 8-44782, 2002-230052, 2002-117147, 10-154168, and 11-39356.

SUMMARY OF THE INVENTION

The present invention is directed to designing of integrated circuits, such as FPGAs, and an object of the present invention is to improve a design support environment by improving the quality of design data and to enhance the design efficiency.

To achieve the foregoing object, the present invention provides an integrated-circuit design support apparatus that supports designing of an integrated circuit having a plurality of pins. The apparatus includes a processor that forms a pin layout matrix by unifying pin layout information of the integrated circuit using a common format and arranging the pin layout information in coordinates.

In this configuration, the pin layout matrix contains data obtained by arranging and expressing the pin layout information of the integrated circuit in coordinates and is pin layout information created in a matrix. The processor is implemented by, for example, a computer, and unifies the supplied pin layout information by using a common format to thereby form the pin layout matrix. The unification processing using a common format is executed by, for example, general-purpose spreadsheet software. With this configuration, since the pin layout information included in the pin layout matrix is unified in a common format, the pin layout information is highly versatile and editing, such as changing, of the information is possible. Further, the information is utilized as basic information for circuit design and mount design to improve efficiency in the design.

To achieve the foregoing object, the processor in the integrated circuit design support apparatus of the present invention may creates an integrated-circuit design library from the pin layout matrix.

In this configuration, the pin matrix and the processor are configured as described above. The integrated-circuit design library includes a group of data classified according to categories, such as attributes generated from the pin layout matrix. That is, the pin layout matrix unified in a common format is formed from the supplied pin layout information and the integrated-circuit design library is formed from the pin layout matrix. The integrated-circuit design library is automatically generated by the processor, based on the pin layout matrix. The integrated-circuit design library and the pin layout matrix can be modified based on design data changed by circuit design or mount design. With this configuration, in accordance with the pin layout matrix unified in a common format, the integrated-circuit design library is automatically generated from the supplied pin layout information and the library can be widely used for the circuit design and mount design. Thus, the latest design data modified by the circuit design and mount design is reflected, thereby contributing to an improvement in the quality of the design data and improving the efficiency in design.

To achieve the foregoing object, in the integrated-circuit design support apparatus of the present invention, the configuration may be such that the processor compares the pin layout information in the integrated circuit design with pin layout information contained in the integrated-circuit design library and outputs a result of the comparison. This configuration facilitates the pin layout information to be updated based on the result of the comparison.

To achieve the foregoing object, in the integrated-circuit design support apparatus of the present invention, the arrangement may be such that the processor compares pin layout information in circuit design or mount design of the integrated circuit with pin layout information contained in the integrated-circuit design library and changes the pin layout information of one or both of the pin layout matrix and the integrated-circuit design library in accordance with a result of the comparison. The arrangement may also be such that change history of the pin layout information is stored in a storage section and the change history is referred to for the circuit design or the mount design of the integrated circuit. The integrated-circuit design support apparatus may further include a display section that displays the change history.

To achieve the foregoing object, the present invention provides an integrated-circuit design support method that supports designing of an integrated circuit having a plurality of pins. The method includes processing for forming a pin layout matrix by arranging pin layout information of the integrated circuit in coordinates and unifying the pin layout information using a common format. According to this configuration, in the integrated-circuit design support method, similarly, the pin layout information is unified in a common format to create the pin layout matrix. Thus, since the pin layout information included in the pin layout matrix is unified in a common format, the pin layout information is highly versatile and editing, such as changing, of the information is possible. Further, the information is utilized as basic information for circuit design and mount design to contribute to an improvement in design efficiency, as described above.

To achieve the foregoing object, the present invention provides an integrated-circuit design support method that supports designing of an integrated circuit having a plurality of pins. The method includes processing for creating a pin layout matrix by arranging pin layout information of the integrated circuit in coordinates and unifying the pin layout information using a common format, and processing for generating an integrated-circuit design library from the pin layout information expressed in the pin layout matrix.

To achieve the foregoing object, the integrated-circuit design support method may further include processing for comparing the pin layout information in the integrated circuit design with pin layout information contained in the integrated-circuit design library and outputting a result of the comparison. The integrated-circuit design support method may further include processing for comparing pin layout information in circuit design or mount design of the integrated circuit with pin layout information contained in the integrated-circuit design library and processing for changing the pin layout information of one or both of the pin layout matrix and the integrated-circuit design library in accordance with a result of the comparison. The integrated-circuit design support method may further include processing for storing change history of the pin layout information into a storage section and processing for referring to the change history for the circuit design or the mount design of the integrated circuit. The integrated-circuit design support method may further include processing for displaying the change history.

To achieve the foregoing object, the present invention provides an integrated-circuit design support program that supports designing of an integrated circuit having a plurality of pins. The program includes a step of creating a pin layout matrix by arranging pin layout information of the integrated circuit in coordinates and unifying the pin layout information using a common format. The program causes a computer to execute the step. According to this configuration, in the integrated-circuit design support program, similarly, the supplied pin layout information is unified in a common format to create the pin layout matrix. Thus, the program contributes to automatic generation of the integrated-circuit design library and so on and can be widely used for circuit design and mount design. The latest design data modified by the circuit design and mount design is reflected, thereby contributing to an improvement in the quality of the design data and improving the efficiency in design, as described above.

To achieve the foregoing object, the present invention provides an integrated-circuit design support program that supports designing of an integrated circuit having a plurality of pins. The program includes a step of creating a pin layout matrix by arranging pin layout information of the integrated circuit in coordinates and unifying the pin layout information using a common format, and a step of generating an integrated-circuit design library from the pin layout information expressed in the pin layout matrix. The program causes a computer to execute the steps.

To achieve the foregoing object, the present invention provides a recording medium that stores an integrated-circuit design support program to be executed by a computer. The program includes a step of creating a pin layout matrix by arranging pin layout information of the integrated circuit having a plurality of pins in coordinates and unifying the pin layout information using a common format.

To achieve the foregoing object of the present invention, the present invention provides a recording medium that stores an integrated-circuit design support program to be executed by a computer. The program includes a step of creating a pin layout matrix by arranging pin layout information of the integrated circuit having a plurality of pins in coordinates and unifying the pin layout information using a common format, and a step of generating an integrated-circuit design library from the pin layout information expressed in the pin layout matrix.

As described above, the present invention is directed to designing of integrated circuits, such as FPGAs, and improves a design support environment including the quality of design data. Thus, the present invention can contribute to an improvement in design efficiency and is useful.

The features and advantages of the present invention are as follows.

1) According to the integrated-circuit design support apparatus, the integrated-circuit design support method, or the integrated-circuit design support program of the present invention, since supplied pin layout information is unified in a common format to form a pin layout matrix, the resulting information is highly versatile and editing, such as changing, of the information is possible. Further, since the information is utilized as basic information for circuit design and mount design, an environment for supporting integrated-circuit design can be improved, design time can be reduced due to a reduction in design work, the quality of design data can be improved, and the design efficiency can be improved.

2) In the integrated-circuit design support apparatus of the present invention, in accordance with the pin layout matrix unified in a common format from supplied pin layout information, the integrated-circuit design library may be automatically generated. With this configuration, the integrated-circuit design library can be widely used for the circuit design and mount design. The latest design data modified by the circuit design and mount design is reflected. Thus, this arrangement contributes to an improvement in the quality of the design data, improves the efficiency in data management and integrated-circuit design library creation, reduces design work hours, and improves the design efficiency.

BRIEF DESCRIPTION OF THE DRAWINGS

Other objects, features, and advantages of the present invention will be more apparent with reference to the accompanying drawings and specific embodiments of the present invention.

FIG. 6 is a table showing one example of a PAD file;

FIG. 7 is a table showing one example of a PIN file;

FIG. 10 is a table showing one example of a vender-associated keyword dictionary;

FIG. 11 is a table showing a result of checking a difference in an FPGA library;

FIGS. 12A and 12B are tables showing change history of the FPGA library;

FIG. 13 is a table showing one example of an FPGA-BA file;

FIG. 15 is a table showing FPGA design change information;

FIG. 22 is a table showing PAD/PIN information;

FIG. 24 is a table showing pin layout information outputs.

DESCRIPTION OF THE PREFERRED EMBODIMENTS

First Embodiment

Figure 1:
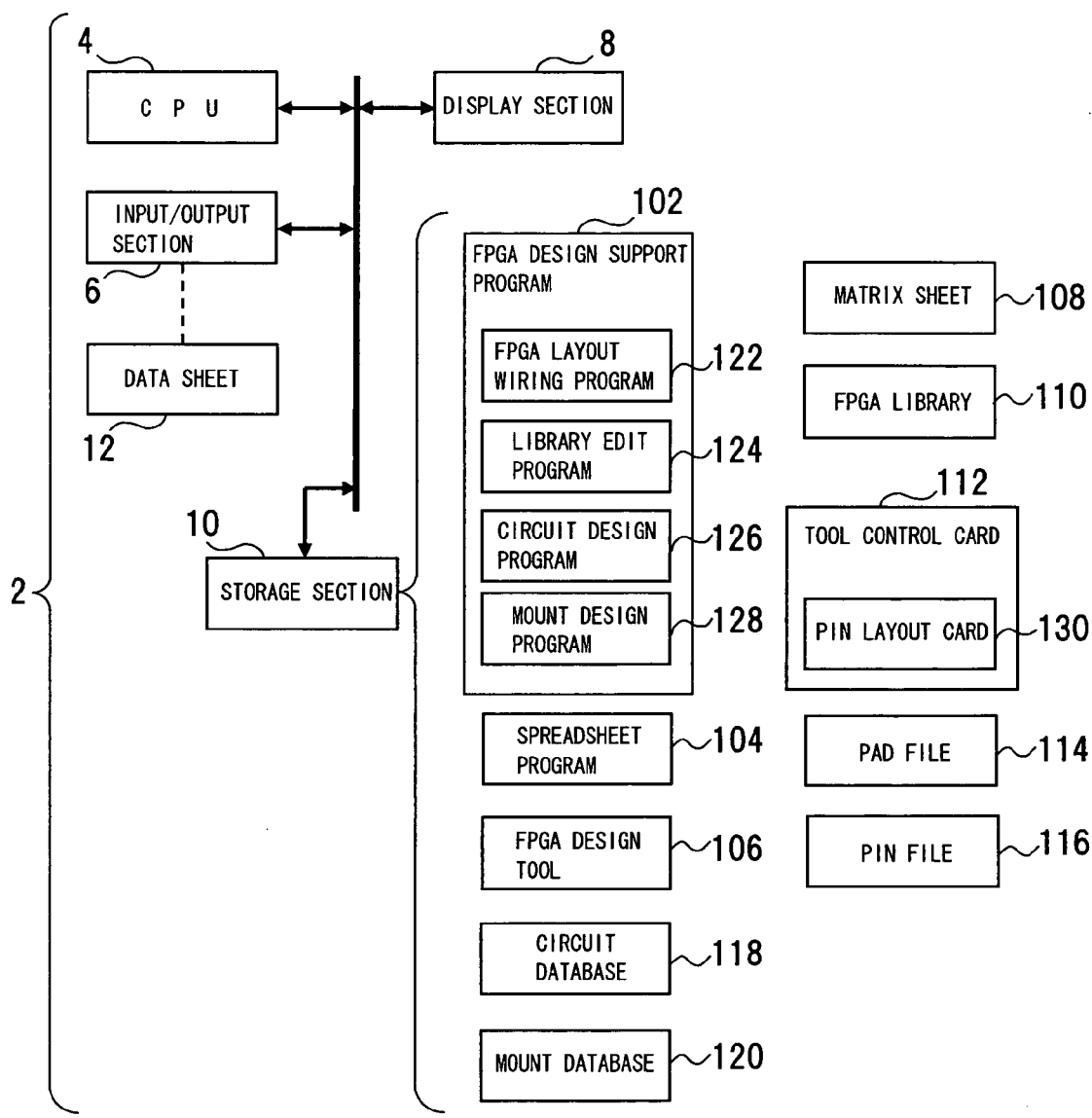
FIG. 1 is a block diagram showing an FPGA design support apparatus according to a first embodiment of the present invention.

A first embodiment of the present invention will now be described with reference to FIG. 1. FIG. 1 is a block diagram schematically showing an FPGA (field programmable gate array) design support apparatus according to a first embodiment of the present invention.

An FPGA design support apparatus 2, which is one example of an integrated-circuit design support apparatus, includes a CPU (central processing unit) 4, an input/output section 6, a display section 8, and a storage section 10. The CPU 4 serves as a processor that executes FPGA-design-support processing and so on in accordance with various programs stored in the storage section 10. The input/output section 6 retrieves a data input, which corresponds to the above-noted processing, and a data output, which is an output resulting from computational processing. The display section 8 is implemented by, for example, a display and is in charge of presenting information regarding data input, data output, and so on. The information presented also includes outputs of print information using a printer. As an integrated-circuit package specification sheet, for example, pin layout information is input from a data sheet 12, such as an FPGA package specification sheet, to the input/output section 6. The data sheet 12 may be electronic data or data other than electronic data.

The storage section 10 may be implemented by a various memories, such as a ROM (read-only memory), a RAM (random-access memory), and another recording medium. The storage section 10 stores an FPGA design support program 102 that serves as an integrated-circuit design support program, a spreadsheet program 104, an FPGA design tool 106 that servers as an integrated-circuit design tool, a matrix sheet 108, an FPGA library 110 that serves as an integrated-circuit design library, a tool control card 112, a layout information (PAD) file 114, a layout information (PIN) file 116, a circuit database (ADF) 118, and a mount database 120. The FPGA design support program 102 includes an FPGA layout wiring program 122 that serves as an integrated-circuit layout wiring program, a library edit program 124, a circuit design program 126, amount design program 128, and so on. The tool control card 112 includes a PIN layout card 130 and so on. The matrix sheet 108 expresses a pin layout matrix in which pin layout information is expressed in coordinates. The matrix sheet 108 and the tool control card 112 constitute a data file. The circuit database 118 stores circuit data and the mount database 120 stores mount data.

The FPGA design support program 102 is a suite of the FPGA layout wiring program 122, the library edit program 124, the circuit design program 126, the mount design program 128, and so on. The FPGA design support program 102 is stored in a storage medium, such as a ROM, and performs data processing as follows:

1) Unifying pin layout information supplied to the input/output section 6 in a common format using the spreadsheet program 104 to thereby create the matrix sheet 108, which serves as a pin layout matrix (In this case, for example, highly versatile spreadsheet software may be used for the spreadsheet program 104), 2) Creating the tool control card 112, 3) Automatically generating the FPGA library 110 from the matrix sheet 108 and editing, such as modifying, the FPGA library 110, 4) Cooperating with a CAD (Computer aided design) program, such as the FPGA design tool 106, supplied from a vender, and sending/receiving data to/from the CAD program, 5) Creating the PIN layout card 130, the PAD file 114, the PIN file 116, the circuit database 118, the mount database 120, and so on, and supporting the creation, and 6) For example, recording and displaying change history of pin layout information.

As described above, the FPGA design tool 106 is a CAD program supplied from a vender. In the FPGA design support program 102, the circuit design program 126 is used for circuit design and is constituted by a program and data that are needed for FPGA circuit design. The mount design program 128 is used for mount design, such as substrate design, and is constituted by a program and data that are needed for FPGA mount design for a substrate or the like.

Figure 2:
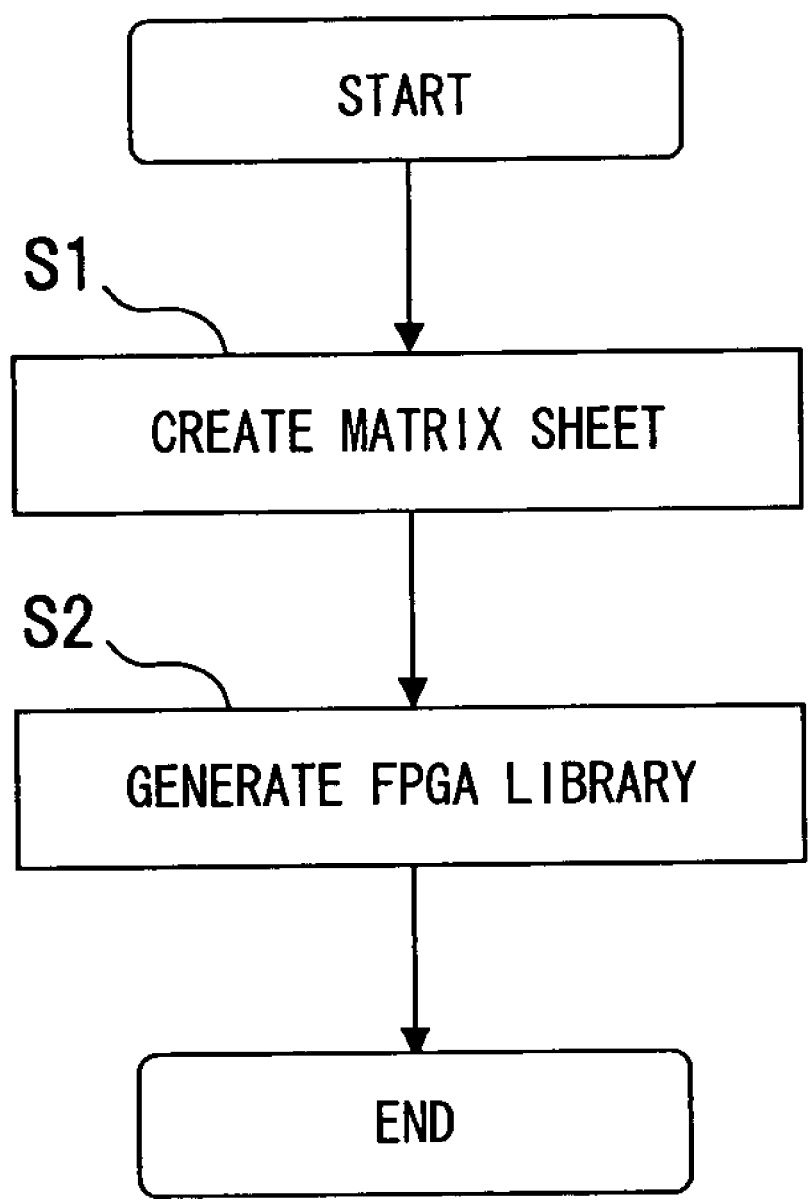
FIG. 2 is a flow chart showing the creation of a matrix sheet and an FPGA library by an FPGA design support method and an FPGA design support program according to the first embodiment of the present invention.

Next, an FPGA design support method or an FPGA design support program according to the first embodiment of the present invention will be described with reference to FIG. 2. FIG. 2 is a flow chart showing processes of the matrix sheet 108 and the FPGA library 110.

In an FPGA design support method or design support processing based on the program, in step S1, the matrix sheet (pin layout information) 108 for an IC (integrated circuit) that implements an FPGA is created by referring to an FPGA package specification sheet. The pin layout information, included in the matrix sheet 108, is an FPGA pin layout image, which is created using the spreadsheet program 104. In this case, even when FPGAs have the same package shape, pins used are different depending on design data and thus how each pin is used needs to be determined in advance.

In step S2, the FPGA library 110 is automatically generated from the pin layout information arranged in the matrix sheet 108. The FPGA library 110 includes, for example, a parts library, a symbol library, and a layout library. The part library stores parts information as design information necessary for the FPGA layout wiring program 122 and the FPGA design tool 106. The symbol library stores symbol information of parts and the layout library stores layout information of the parts. The FPGA library 110 is created for each circuit design.

The pin layout information is changed through circuit design and/or mount design and the resulting change information is reflected in the matrix sheet 108 and the FPGA library 110.

The processing described above forms a foundation for the FPGA design support environment, provides high-quality design data, and facilitates data management. The processing described above is used for circuit design and mount design, to thereby improve design efficiency.

Figure 3:
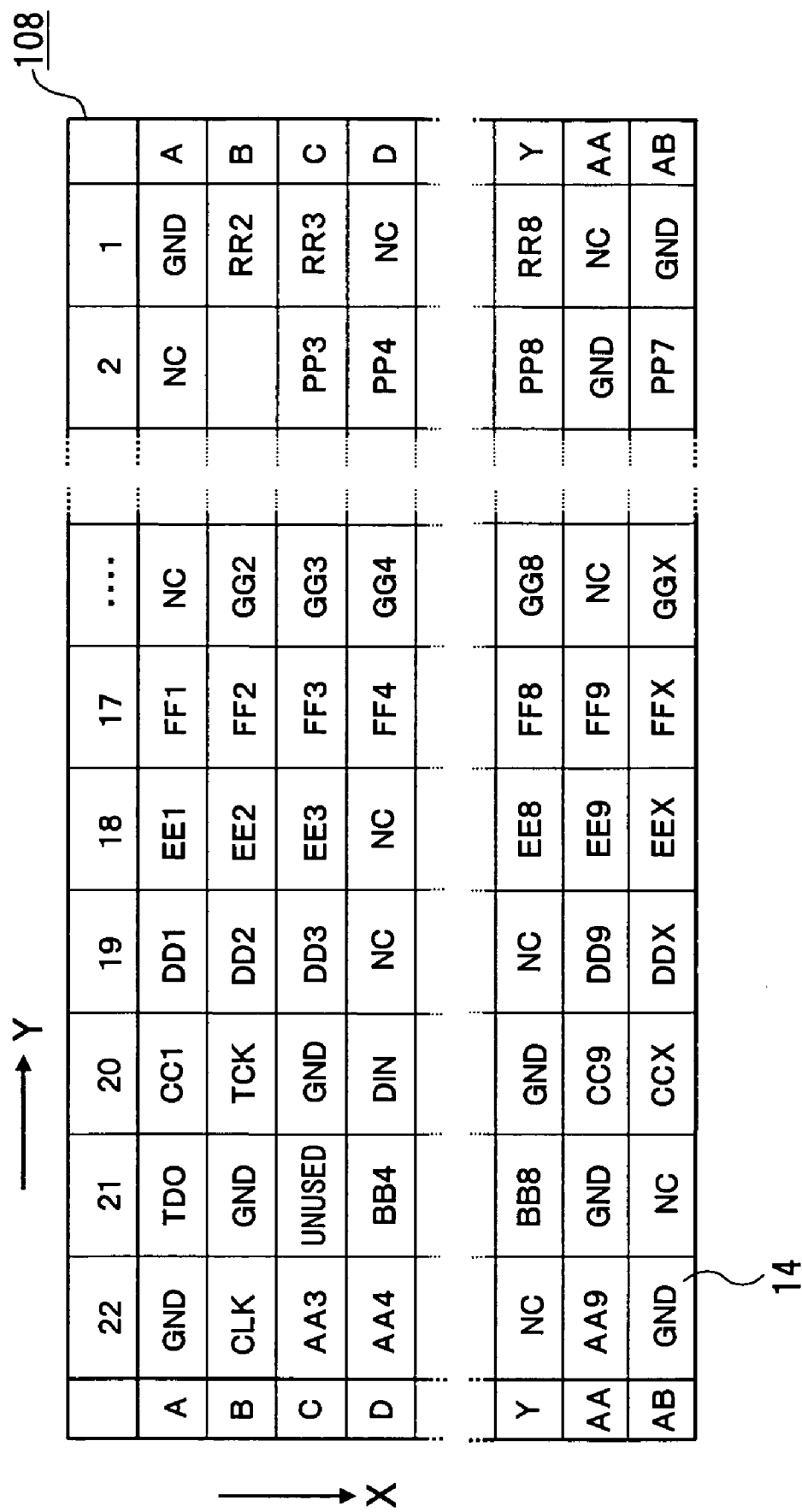
FIG. 3 is a table showing one example of the matrix sheet.

The matrix sheet 108 will now be described with reference to FIG. 3. FIG. 3 shows one example of the matrix sheet 108.

This matrix sheet 108 contains electronic data showing a pin layout matrix created by the spreadsheet program 104 and the electronic data are unified using the common format of the spreadsheet program 104. In the matrix sheet 108, the spreadsheet program 104 creates a plurality of cells 14 that correspond to the layout sequence of the FPGA package, with X coordinates in the vertical direction and Y coordinates in the horizontal direction. In each cell 14, an attribute, such as a logic-signal name, power supply, grand, non-connection, or the like, is written. In the illustrated matrix sheet 108, for example, attribute "GND (ground)" is set for pin A22, and logic "TDO (test data output)" is set for pin A21.

Figure 4:
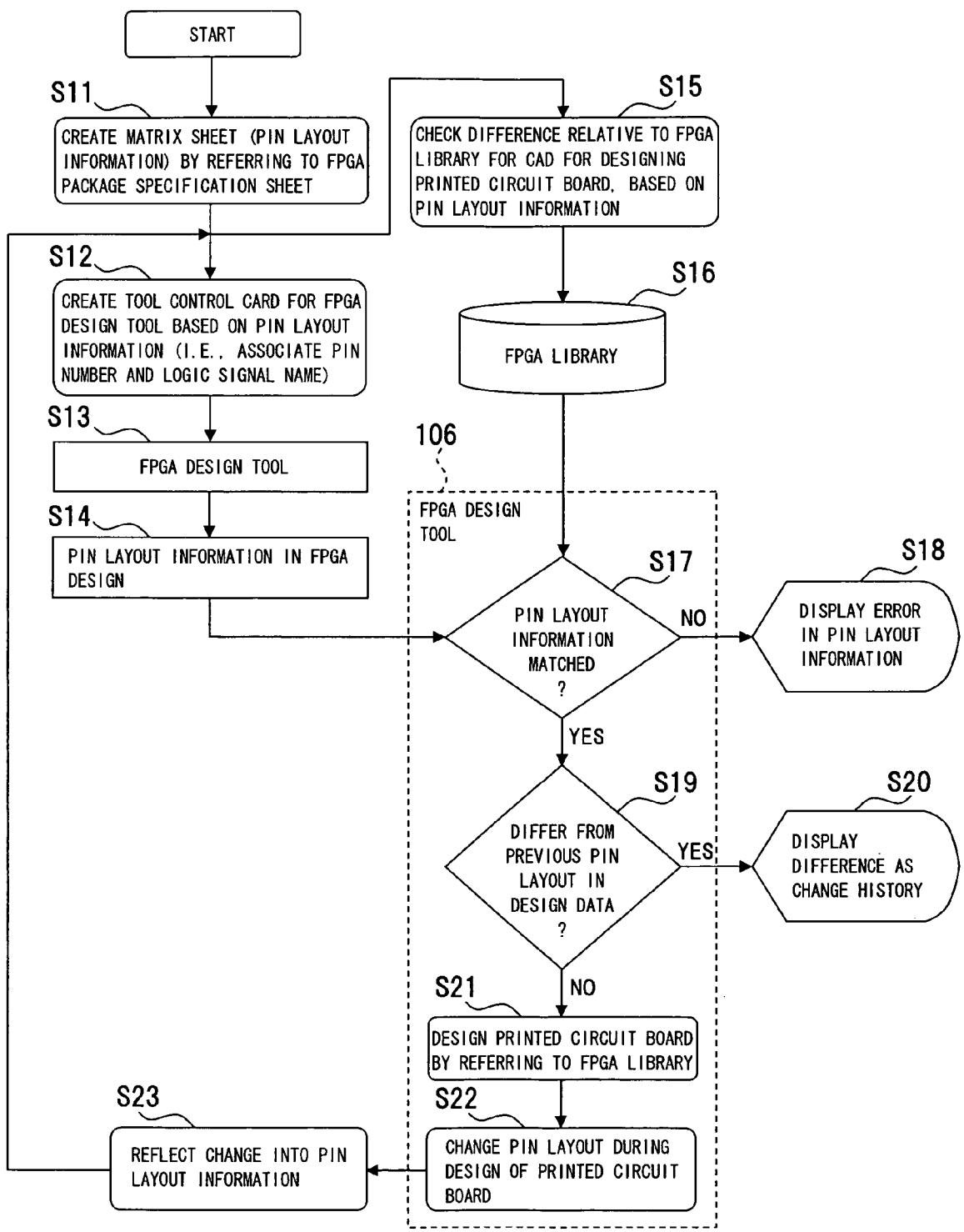
FIG. 4 is a flow chart showing processes of the FPGA design support method and the FPGA design support program according to the first embodiment.

The FPGA design support method or the FPGA design support program will now be described with reference to FIG. 4. FIG. 4 is a flow chart showing processes of the FPGA design support method and the FPGA design support program.

In the FPGA design support method or the design support processing based on the program, in step S11, the matrix sheet (pin layout information) 108 for an IC (integrated circuit) that implements an FPGA is created by referring to an FPGA package specification sheet. The pin layout information included in the matrix sheet 108 is an FPGA pin layout image, which is created using the spreadsheet program 104. In this case, even when FPGAs have the same package shape, pins used are different depending on design data and thus how each pin is used needs to be determined in advance.

In step S12, the tool control card 112 for the FPGA design tool 106 is created in accordance with the created pin layout information. On the tool control card 112, pin numbers and logic signal names are associated. In step S13, the tool control card 112 is passed over to the FPGA design tool 106. In step S14, the pin layout information described on the tool control card 112 is supplied to the FPGA design tool 106. As described above, the FPGA design tool 106 is a CAD program supplied from a vender.

In the FPGA design, in step S15, the difference between the pin layout information and the FPGA library 110 for CAD for designing, for example, a PCB (printed circuit board) on which the FPGA is mounted is checked. As described above, the FPGA library 110 is automatically crated based on the matrix sheet 108. Pin layout information is read from the FPGA library 110 (in step S16) and is supplied to the FPGA design tool 106 in step S16. In step S17, the FPGA design tool 106 determines whether or not the pin layout information (obtained in step S14) for the FPGA design and the pin layout information (obtained in step S16) in the FPGA library 110 match each other. When the sets of pin layout information do not match each other, in step S18, an error in the pin layout information is displayed on the display section 8 and is reported.

When the sets of pin layout information match each other, a determination is made in step S19 as to whether or not there is a difference relative to a previous pin layout in the design data. When there is any difference, in step S20, the difference is displayed on the display section 8 and is reported as a change history. In step S21, the printed circuit board is designed by referring to the FPGA library 110. During the design of the printed circuit board, when a change is made to the pin layout in step S22, the change is reflected in the pin layout information in step S23. After the pin layout information is changed, the process returns to step S12. The reflection in the pin layout information is processing for editing and updating the pin layout information in the matrix sheet 108 and the FPGA library 110, as described above, and is executed by the library edit program 124 and so on of the FPGA design support program 102.

Through the processes described above, the FPGA library 110 is generated from the created matrix sheet 108 and the pin layout information changed during the circuit design and/or mount design is reflected in the matrix sheet 108 and the FPGA library 110 so that the stored pin layout information is updated. The change history of the pin layout information is also displayed on the display section 8 and is stored in, for example, the FPGA library 110. The change history is utilized for circuit design and mount design, so that the latest pin layout information is utilized for the circuit design and mount design. As a result, the quality of design data is improved and the efficiency of design is enhanced.

Second Embodiment

Figure 5:
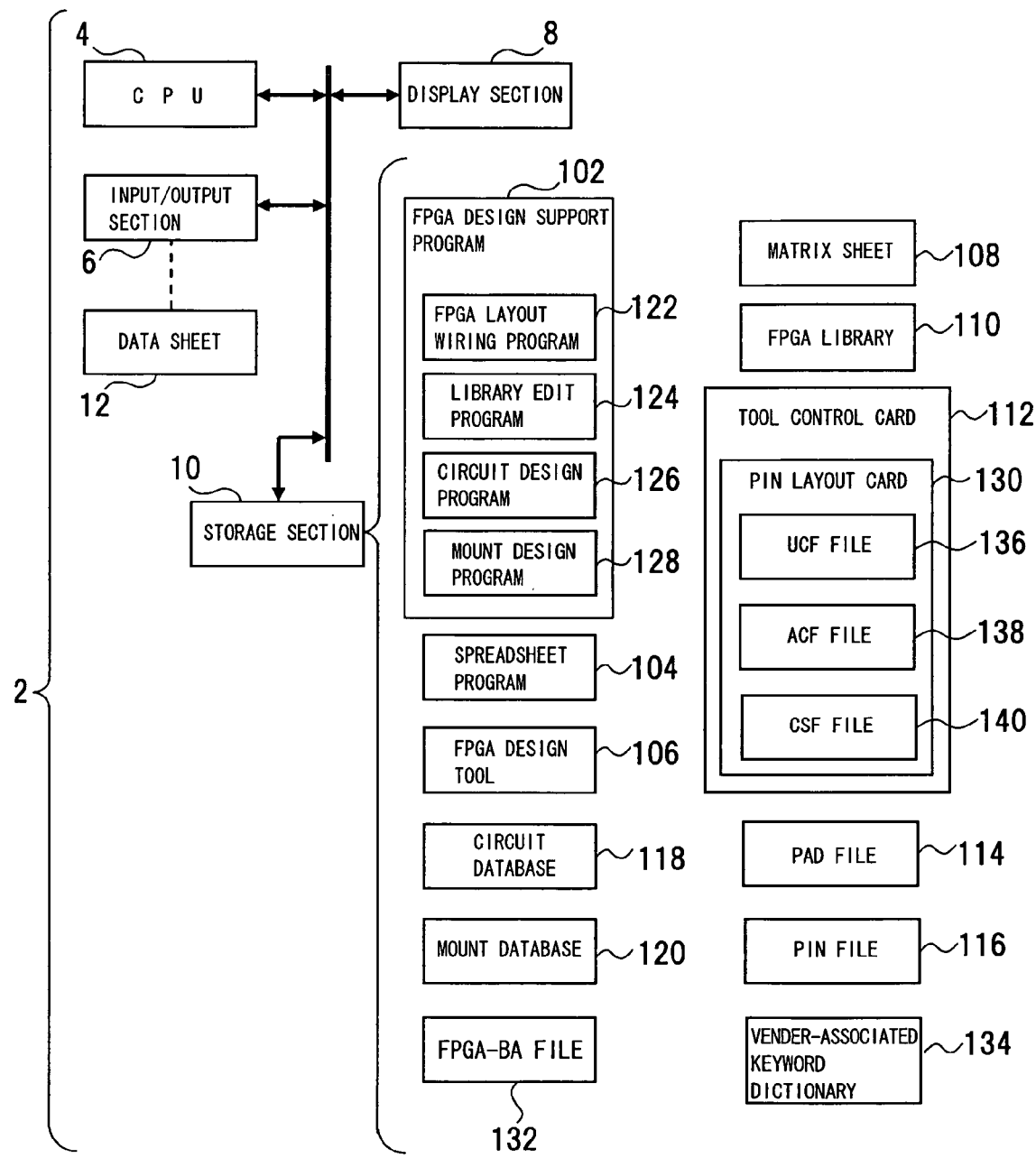
FIG. 5 is a block diagram showing an FPGA design support apparatus according to a second embodiment of the present invention.

A second embodiment of the present invention will now be described with reference to FIG. 5. FIG. 5 is a block diagram schematically showing an FPGA design support apparatus according to a second embodiment of the present invention. The same portions as those in the first embodiment are denoted with the same reference numerals.

This FPGA design support apparatus 2 includes a CPU 4, an input/output section 6, a display section 8, and a storage section 10, as described above. The CPU 4 executes FPGA-design-support processing in accordance with programs stored in the storage section 10.

In order to achieve the FPGA-design-support processing, the storage section 10 stores an FPGA design support program 102, a spreadsheet program 104, an FPGA design tool 106, a matrix sheet 108, an FPGA library 110, a tool control card 112, a PAD file 114, a PIN file 116, a circuit database 118, and a mount database 120, an FPGA-BA (back annotation) file 132, a vender-associated keyword dictionary 134, and so on. The FPGA design support program 102 includes an FPGA layout wiring program 122, a library edit program 124, a circuit design program 126, a mount design program 128, and so on. The tool control card 112 includes a PIN layout card 130 and so on. The PIN layout card 130 contains a constraint condition (UCF) file 136, a constraint condition file (ACF) file 138, and a constraint condition (CSF) file 140, and so on.

For example, the FPGA-design-support processing includes:

a) Processing for editing an FPGA library,
  b) Processing for inputting (importing) and outputting (exporting) a common format in a spreadsheet program format,
  c) Processing for automatically generating an FPGA library,
  d) Processing for referring to and editing an FPGA library in circuit design or mount design,
  e) Processing for checking an FPGA library difference,
  f) Processing for inputting FPGA back annotation,
  g) Processing for inputting FPGA design information,
  h) Processing for changing an FPGA pin layout, and
  i) Processing for outputting FPGA back annotation.

The above-noted FPGA-library edit processing (a) includes establishing a common format in a spreadsheet program format during the creation of the FPGA library 110 to standardize FPGA design data supplied from FPGA venders.

The FPGA library 110 is created through the FPGA library editing. The FPGA library 110 stores pin layout information that is FPGA design data standardized in the common format using the above-noted spreadsheet program format.

The UCF file 136 stores constraint condition data related to an initial input. After the design, design data is transferred to the UCF file 136. The UCF file 136 includes constraint items, such as the relationship between logic pin names and vender pin names as pin layout, an inter-path timing constraint with specified starting and endpoints, an inter-path timing constraint associated with a clock, a clock cycle constraint, and so on.

The PAD file 114 stores pin layout information. This pin layout information is based on a design report output from the FPGA design tool 106. FIG. 6 shows examples of items of the PAD file 114.

The vender-associated keyword dictionary 134 is a file that stores keywords for converting the PIN layout card 130, which is created using the FPGA design support program 102, into data associated with venders.

The ACF file 138 stores constraint condition data related to an initial input. With regard to the CSF file 140, design data is transferred thereto after the design, so that constraint condition data during and after wiring is stored in the CSF file 140.

The PIN file 116 stores pin layout information. This pin layout information is based on a design report output from the FPGA design tool 106. FIG. 7 shows examples of items of the PIN file 116.

Figure 8:
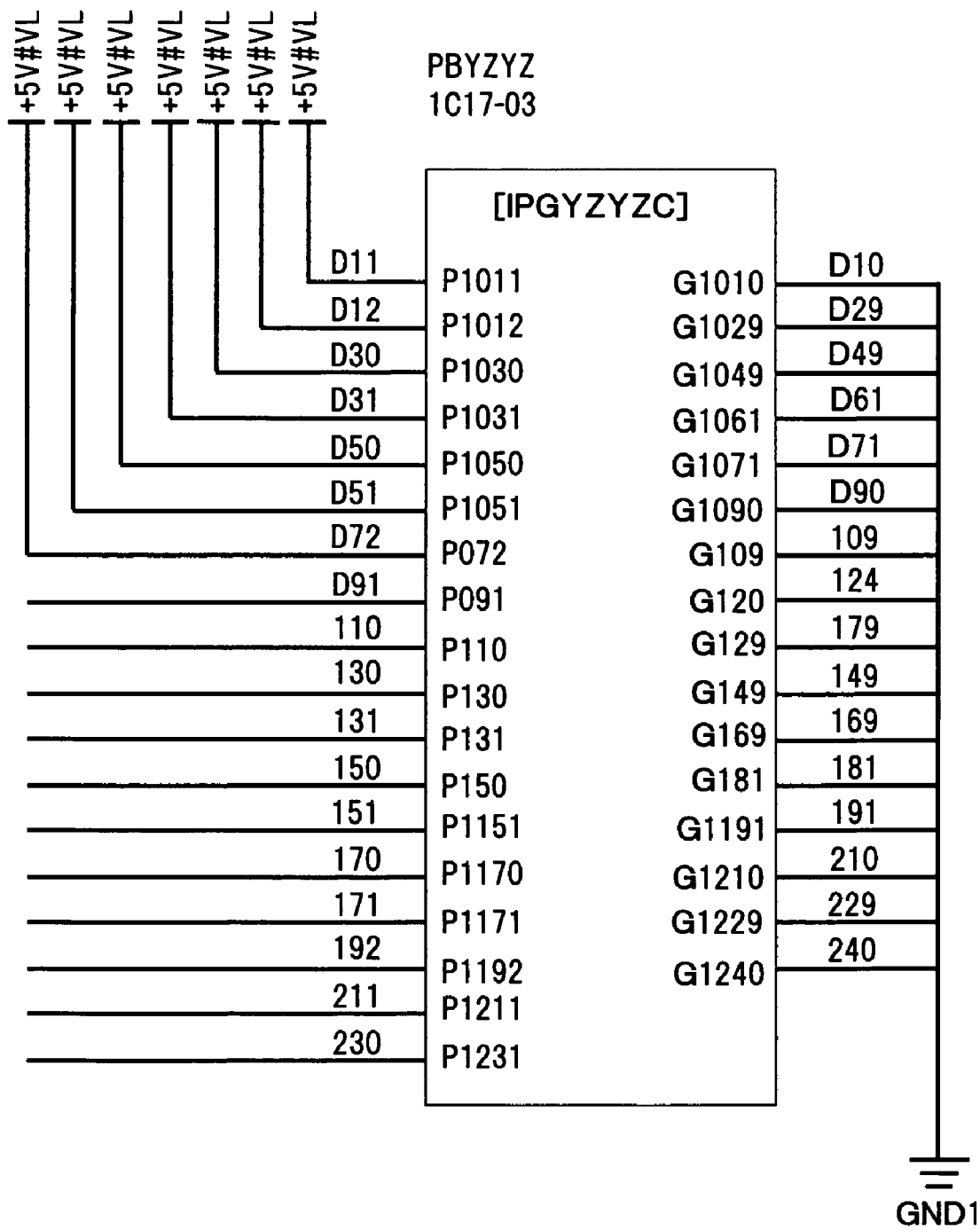
FIG. 8 shows examples of circuit symbols.

The circuit database 118 stores circuit database and the mount database 120 stores mount data. With regard to the circuit data stored in the circuit database 118, for example, pins other than pins having logic-pin name "I/O" are arranged at the upper portions of symbols. Each symbol indicates a logic pin name. Pins having logic-pin name "I/O" are arranged from the upper portion to lower portion of the symbols in the ascending order of physical pin names. "I/O" is indicated at the symbols. Examples of the circuit symbols in this case are shown in FIG. 8. In another example of the circuit data, a pin that is independent of a bank number is created at the last added number of signal portions. Each symbol indicates a "logic pin name" or "logic pin name (vender pin name)". Pins that depend on bank numbers is divided into a plurality of portions for respective bank numbers and arranged from the upper portion to lower portion of the symbols in the ascending order of logic pin names by considering the logic pin names. Each symbol indicates a "logic pin name", "B bank number—IO added number", or "I/O (vender pin name)". Symbols are created for power-supply/ground pins as power-supply/ground portions and the power-supply/ground pins are divided into portions by considering logic pin names and a screen size.

Figure 9:
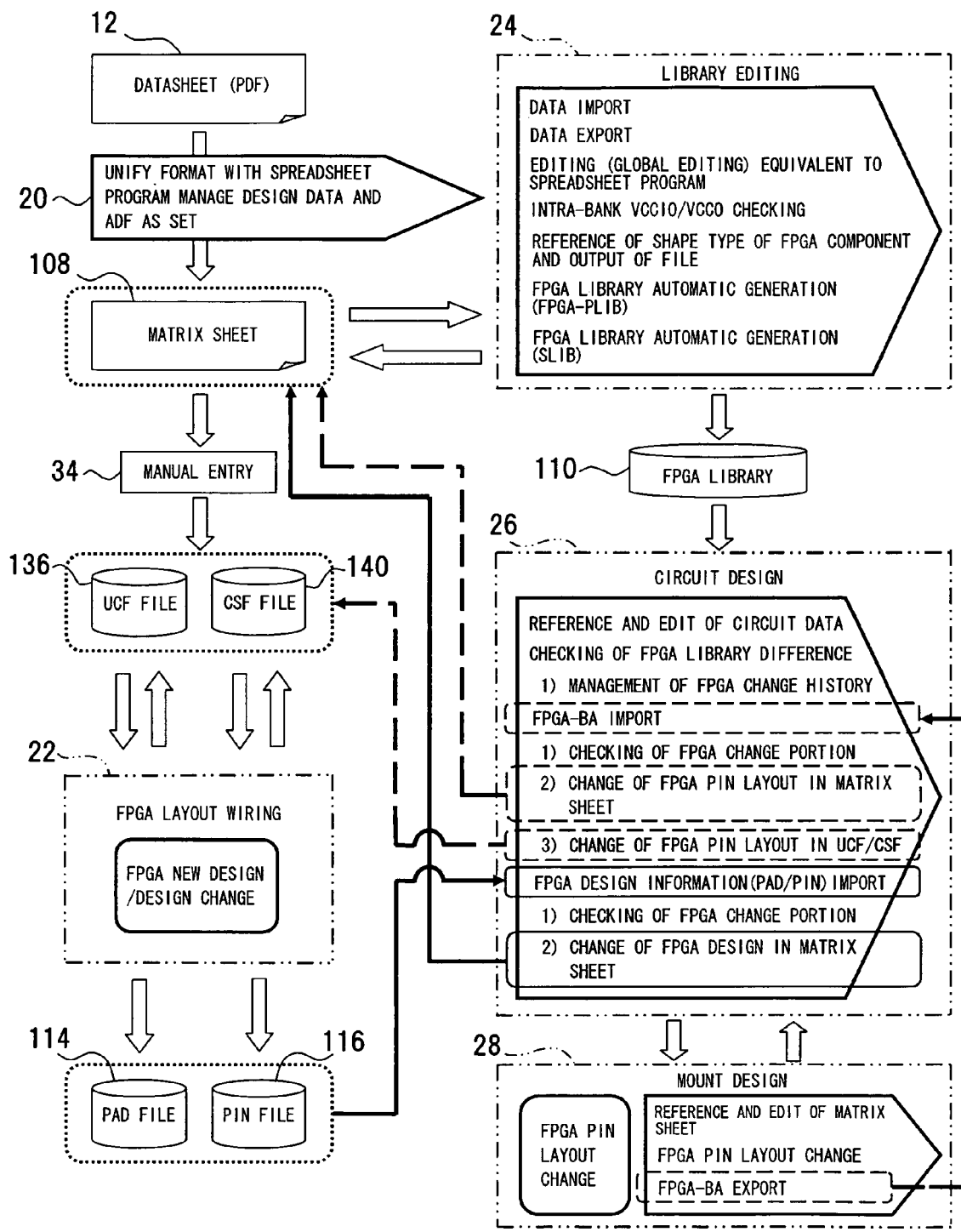
FIG. 9 is a diagram showing the system configuration of the FPGA design support apparatus.

Next, the system configuration of the FPGA design support apparatus will now be described with reference to FIG. 9. FIG. 9 shows one example of the system configuration of the FPGA design support apparatus.

The FPGA design support apparatus 2 (described above and shown in FIG. 5) has various functions provided by the FPGA design support program 102. Examples of the functions include a format-unification function/design-data management function 20, an FPGA layout wiring function 22, a library edit function 24, a circuit design function 26, and a mount design function 28. The format-unification function/design-data management function 20 is a basic function for the FPGA design support program 102 and is accomplished by the spreadsheet program 104 and so on. The FPGA layout wiring function 22 is accomplished by the FPGA layout wiring program 122, the library edit function 24 is accomplished by the library edit program 124, the circuit design function 26 is accomplished by the circuit design program 126, and the mount design function 28 is accomplished by the mount design program 128. In FIG. 9, arrows indicate processes and data transfers.

The format-unification function/design-data management function 20 performs processing for unifying the formats of design data input from the data sheet 12, and manages, as a set, the circuit database (ADF) 118 and the design data in the unified format. Further, the format-unification function/design-data management function creates the matrix sheet 108. The data sheet 12 is created in a document format, for example, a PDF (portable document format) and the format created depends on each designer. With the format-unification function/design-data management function 20, design data is received from the data sheet 12 and is unified into the specific format of the spreadsheet program 104. The unified format is used to manage the design data, and the matrix sheet 108 is created by the spreadsheet program 104 and is output.

In the format unification processing of the format-unification function/design-data management function 20, for example, an association/relationship as shown in FIG. 10 is set, as the vender-associated keyword dictionary 134, between necessary items set by the spreadsheet program 104 and the pin layout information in the matrix sheet 108. In FIG. 10, characters A and B represent specific tools, respectively. In this case, for creation of a new matrix sheet 108, when the already-existing PAD 114 and the PIN file 116 are available, existing data is extracted from the PAD file 114 and the PIN file 116. A physical pin name having the same name as a corresponding vender pin name is omitted. The vender pin name is defined by its pin number or position.

With the prior and existing design data whose formats are not unified, design data are managed by individual designers. This makes it difficult to check compatibility between design data and also requires a cross probing function and/or design data management synchronized with the design database. Since the format-unification function/design-data management function 20 is provided, the format is unified and the compatibility checking between design data is facilitated.

The matrix sheet 108 is used by processing of manual entry 34 to create the UCF file 136 and the CSF file 140. Thus, the UCF file 136 and the CSF file 140 contain constraint condition data unified into the format of the above-noted spreadsheet program 104.

The FPGA layout wiring function 22 is a function for newly designing an FPGA or changing the design of the FPGA as the FPGA layout wiring processing. During the execution of the function, The FPGA layout wiring function 22 interacts with the UCF file 136 and the CSF file 140 to use the constraint condition data stored therein. Thus, based on the constraint condition data unified in the above-noted format, the FPGA is newly designed or the design thereof is changed and, consequently, the PAD file 114 and the PIN file 116 are created.

The library edit function 24 is used for processing, such as processing for importing data, processing for exporting data, processing for editing data (global editing), processing for checking a voltage (VCCIO/VCCO) in a bank, processing for referring to the shape type of FPGA components and outputting a file, processing for automatically generating a library (FPGA-PLIB or SLIB), and so on. With the library edit function 24, the FPGA library 110 is edited, registration of the same voltage value in intra-bank voltages (VCCIO/VCCO) is checked as a checking function, and voltage values are edited all at once. In addition, for example, portion division information considering bank numbers, logic pin names, and symbol shapes are automatically generated.

Edit processing performed by the library edit function 24 is as follows.

i) Editing (Global Editing) Equivalent to the Spreadsheet Program 104

For editing pin information, the value of the intra-bank voltage VCCIO/VCCO is set so that different voltage values cannot be defined in a bank.

ii) Checking the Intra-Bank Voltage VCCIO/VCCO

When different voltage values are defined for the intra-bank voltage VCCIO/VCCO, it is determined as an error and information indicating the error is displayed on the display section 8.

iii) Referring to Shape Type of FPGA Components and Outputting File

On the image of the spread sheet program 104, the shape type of FPGA components are reffered to and the file is outputted. In this case, items to which reference is made are physical pin names, vender pin names, and logic pin names. With respect to a physical pin name, one that has the same name as a vender pin name is not displayed. Logic pin names can be color-coded and the color-coded categories are, for example, CND, VCCINT, VCCIO, VCCO, NC, and a testing pin. The borders can be identified based on bank numbers.

vi) Library Automatic Generation (FPGA-PLIB)

When multiple FPGAs are used on the same substrate, the pin layouts of the FPGAs on the substrate vary from each other due to the relationship in connection with another LSI or connectors, depending on the arrangement position on the substrate. For example, even with the same access key (component specification/circuit mark), libraries having different pin information (e.g., an input/output category, the availability of opening, an intra-bank VCCIO/VCCO voltage value) are set. Thus, unlike typical components, FPGA do not have the relationship of "file name access=key (component specification/circuit mark)". Logic pin names and bank numbers are required as required items for only FPGA components. When physical pins are not defined by the spreadsheet program 104, the vender pin names are used and the digits are adjusted ("0" filling") same as the vender pin names. Further, TCAD pin names defined in a pre-set "vender pin name relationship table" are used. When the availability of opening the add-in of the spreadsheet program 104 is not defined, "open impossible" is set only for a case in which the input/output category is "input", otherwise, the item is set as "undefined".

v) Library Automatic Generation (SLIB)

Signal pins are automatically divided into portions in accordance with bank numbers and logic pins names are indicated on the symbols. When bank names are so long, the global edit function is used to change the bank names all at once. A common power-supply pin that does not depend on a bank is automatically divided into power-supply ground portions for each logic pin names or for each power-supply voltage and pins are assigned in the ascending order of pin names. The intra-bank power supply pin (VCCIO/VCCO) is either defined to be in the same symbol as a signal pin for each bank or is automatically divided into power-ground symbols. In this case, examples of the circuit symbols are as above noted (shown in FIG. 8).

The FPGA library 110 created by such processing is utilized for the circuit design function 26. The circuit design function 26 executes processing, such as referring to and editing the circuit data, checking a difference in the FPGA library, importing FPGA-BA, and importing FPGA design information (PAD/PIN). In the FPGA library difference checking, 1) FPGA change-history management processing is executed. In the FPGA-BA import processing, 1) FPGA change-portion checking, 2) FPGA pin layout change in the matrix sheet 108, and 3) FPGA pin layout change in the UCF file 136 and the CSF file 140 are executed. In the processing for importing FPGA design information (PAD/PIN), 1) FPGA change-portion checking and 2) FPGA design change in the matrix 108 are executed.

In the processing for referring to and editing the circuit data, a circuit editor refers to and edits the design data whose format has been unified by the spreadsheet program 104, so that a difference in the FPGA library is checked. For example, when the version number of the FPGA library 110 is different, for example, a check result as shown in FIG. 11 is displayed on the display section 8. When there is such a difference, a panel for checking whether or not the latest FPGA library 110 can be loaded is displayed on the display section 8. In this case, when the checking result indicates "loadable", the library information is updated, and when the checking result indicates "unloadable", old library information is left unchanged.

In response to the FPGA library difference check processing, FPGA-change-history management processing is executed. When the latest FPGA library 110 is "loadable", the information is updated to the latest library information, so that the FPGA-change-history information can be referred to. That is, the check result is displayed as shown in FIG. 12A and the library information is updated to the latest information as shown in FIG. 12B.

The FPGA-BA import processing is executed when the FPGA pin layout change is executed. This import processing is executed to check an FPGA change portion and manage the FPGA-BA history, before the FPGA library 110 and the circuit database 118 are updated. For example, items, as shown in FIG. 13, in the FPGA-BA file 132 are updated.

In the FPGA change portion check processing, information of the FPGA-BA file 132 and the FPGA library 110 is used to output a list (FIG. 12B) with which change portions of the FPGA pin layout can be checked. The list and the circuit editor can perform cross probing therebetween.

In the FPGA change portion check processing, a panel for checking whether or not data in the latest FPGA library 110, the UCF file 136, and the CSF file 140 are updated is displayed on the display section 8. The display of the data can prevent the user from performing an incorrect operation, such as a designation mistake with respect to the FPGA-BA file 132. For updating the data, the process proceeds to the management of FPGA-BA history, the FPGA pin layout change (FPGA-BA) of the matrix sheet 108, and the pin layout change of the UCF file 136 and the CSF file 140. When the data is not updated, old library information is left unchanged.

Figure 14:
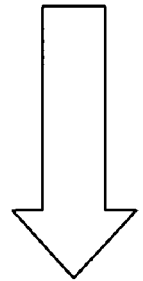
FIG. 14 shows one example of history of the FPGA-BA file.

In the FPGA-BA history management processing, when the data update is selected, the FPGA-BA history information is updated. The FPGA-BA history information is displayed on the display section 8 and can be referred to. The FPGA-BA history information is displayed, for example, as shown in tables (A) and (B) in FIG. 14.

In the pin layout change (FPGA-BA) processing for the matrix sheet 108, data in the matrix sheet 108 is updated with respect to a change portion based on the FPGA-BA file 132. The library information is updated in cooperation with the circuit editor based on the pin layout information of the matrix sheet 108, and the updated data is incorporated into the FPGA library 110. Thereafter, an FPGA-library difference is checked.

In the FPGA pin layout change (FPGA-BA) processing for the UCF file 136 and the CSF file 140, the UCF file 136 and the CSF file 140 are updated, with respect to a change portion, based on the FPGA-BA file 132. In this case, with respect to the UCF file 136 and the CSF file 140, since not all items from the matrix sheet 108 can be incorporated, editing and checking by the manual entry 34 or the like are required. In particular, when items in the UCF file 136 and the CSF file 140 are not defined, items to be defined by the matrix sheet are input by the manual entry 34. The library information is updated in cooperation with the circuit editor based on the matrix sheet 108, and then the pin layout information of the updated FPGA library 110 is incorporated. Thereafter, an FPGA-library difference is checked.

When the FPGA design is changed, the FPGA design information (PAD/PIN) import processing employs a method for importing the FPGA design information (PAD/PIN). The reason is to accomplish the FPGA-change-portion check and the FPGA design change in the matrix sheet 108 before the FPGA library 110 and the circuit database 118 are updated.

For items of the PAD file 114, reference is made to FIG. 6, and for items of the PIN file 116, reference is made to FIG. 7.

In the FPGA change portion check processing, information of the PAD file 114, the PIN file 116, and the FPGA library 110 is used to output a list with which change portions and change history of the FPGA design can be checked. FIG. 15 shows an example of the list indicating the change history information. The list and the circuit editor can perform cross probing therebetween.

In the FPGA design change processing for the matrix sheet 108, the matrix sheet 108 is updated with respect to a change portion based on the PAD file 114 and the PIN file 116. The library information is updated in cooperation with the circuit editor by using the pin layout information of the matrix sheet 108, and the updated library information is incorporated. Thereafter, the process proceeds to the FPGA-library difference checking.

The mount design function 28 refers to the matrix sheet 108. Specifically, the mount design function 28 refers to and edits the matrix sheet 108 based on the FPGA component on the mount editor. In this case, an FPGA pin layout change is made on only an FPGA component. The change rules in this case are, for example, as follows. A change is limited to components having the same component name. When a pin is a signal pin before change, a change is limited to a signal pin. When a pin is a power supply pin before change, the pin is a power supply pin after the change. With respect to pin names to be changed, whether or not a set of "a pin name before change and a pin name after change" is defined for each net is checked in the end, so that a contradictory change is prevented.

Figure 16:
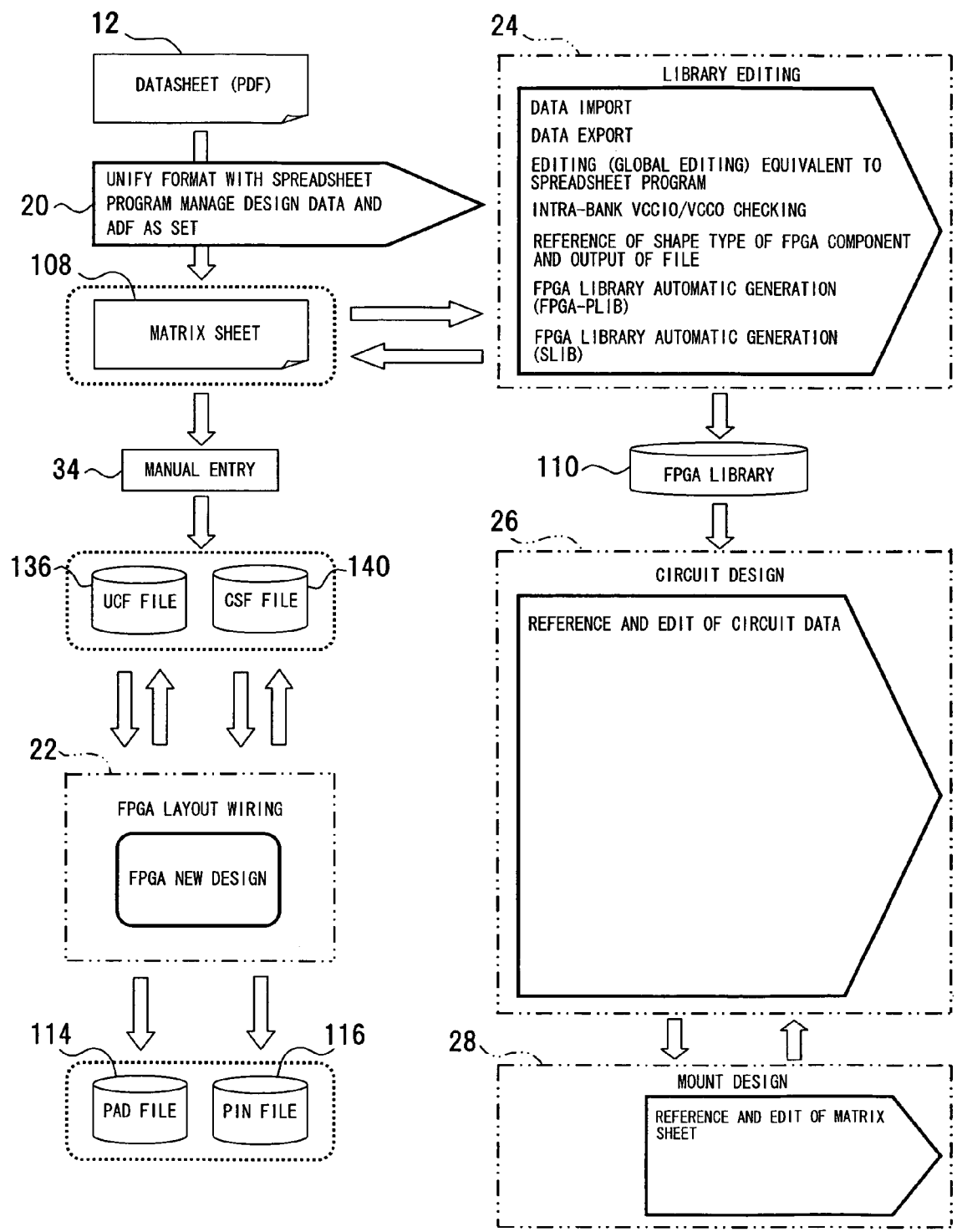
FIG. 16 is a diagram showing a system configuration for new-design processing.
Figure 17:
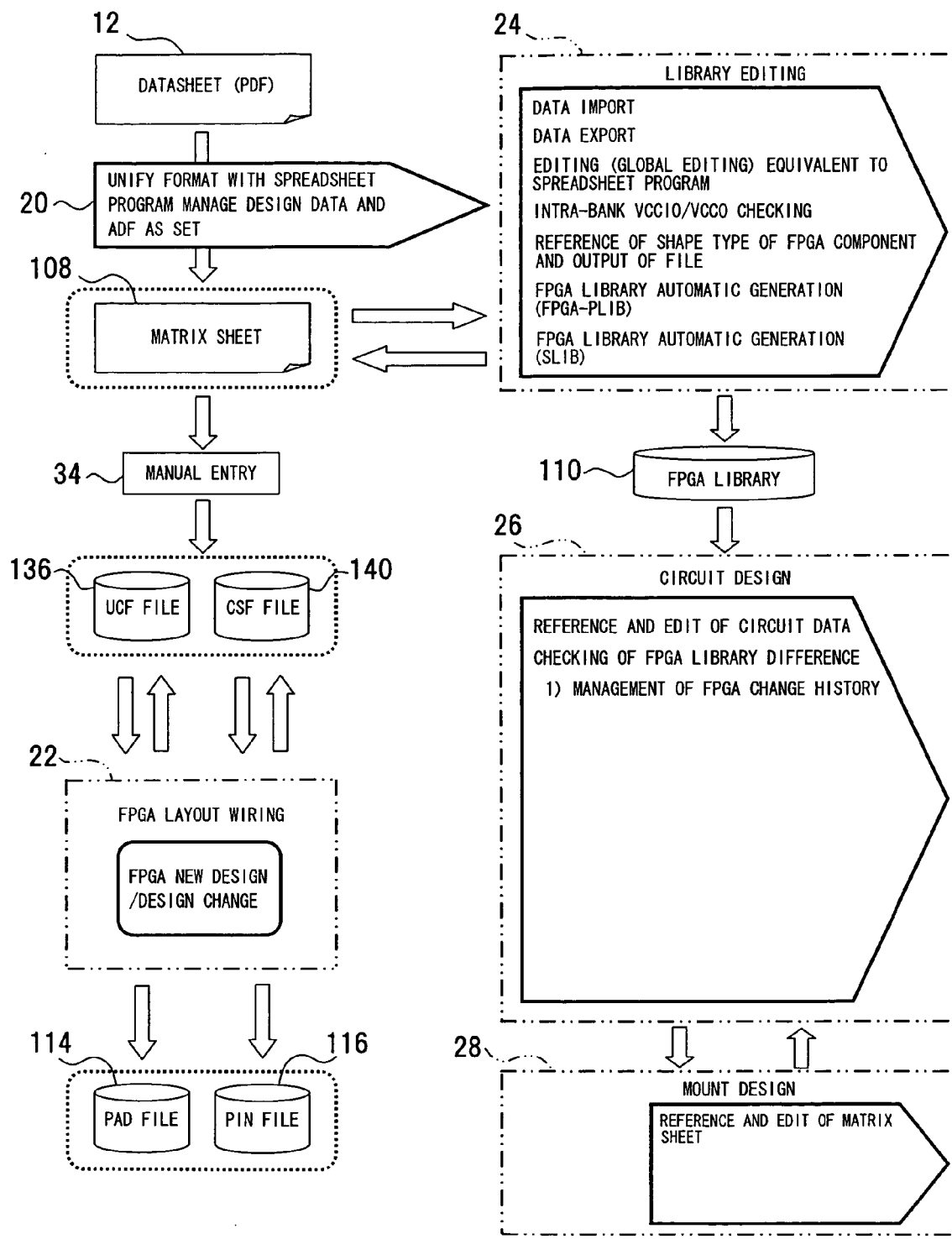
FIG. 17 is a diagram showing a system configuration for processing for changing the FPGA library.
Figure 18:
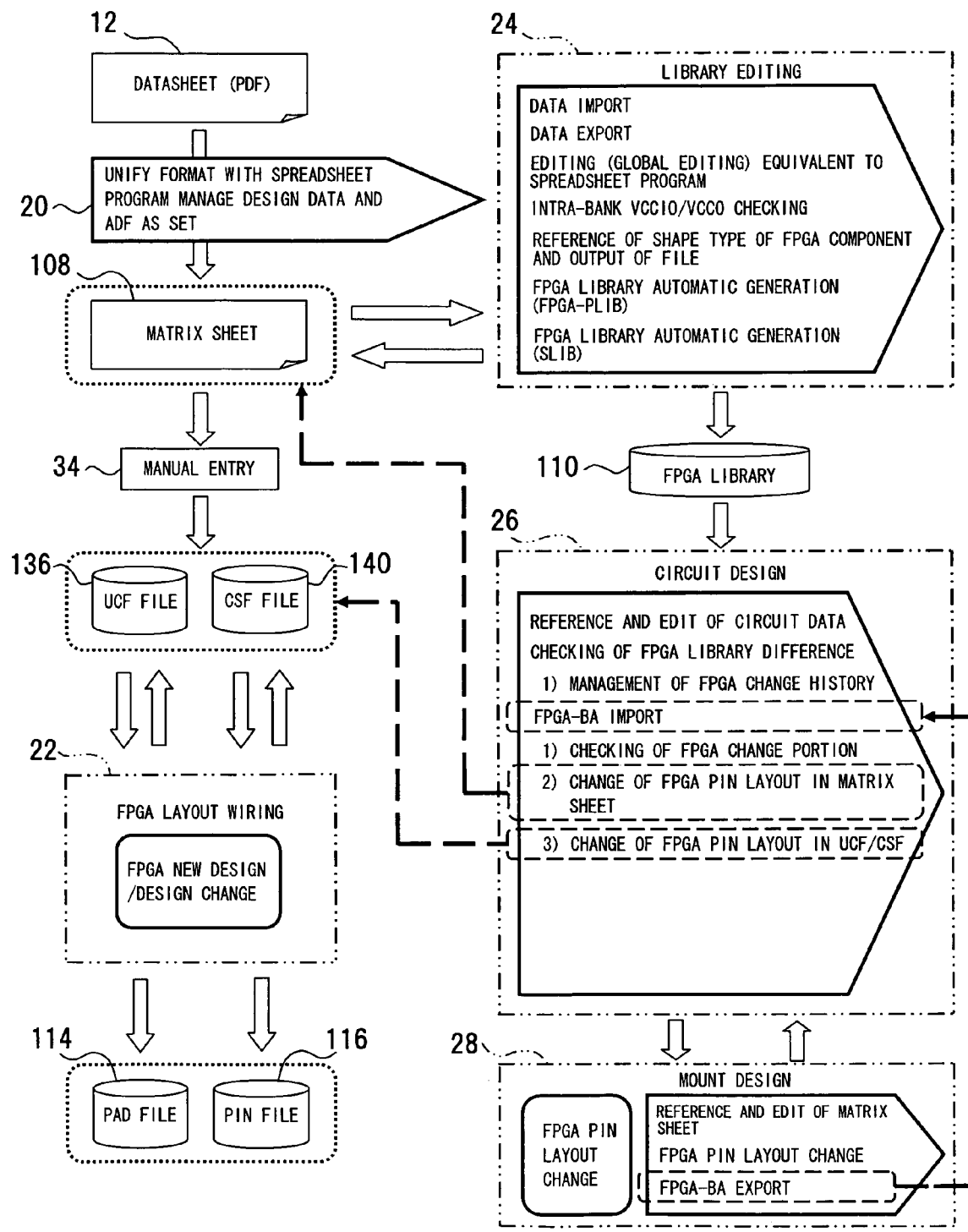
FIG. 18 is a diagram showing a system configuration for processing for changing the FPGA pin layout.
Figure 19:
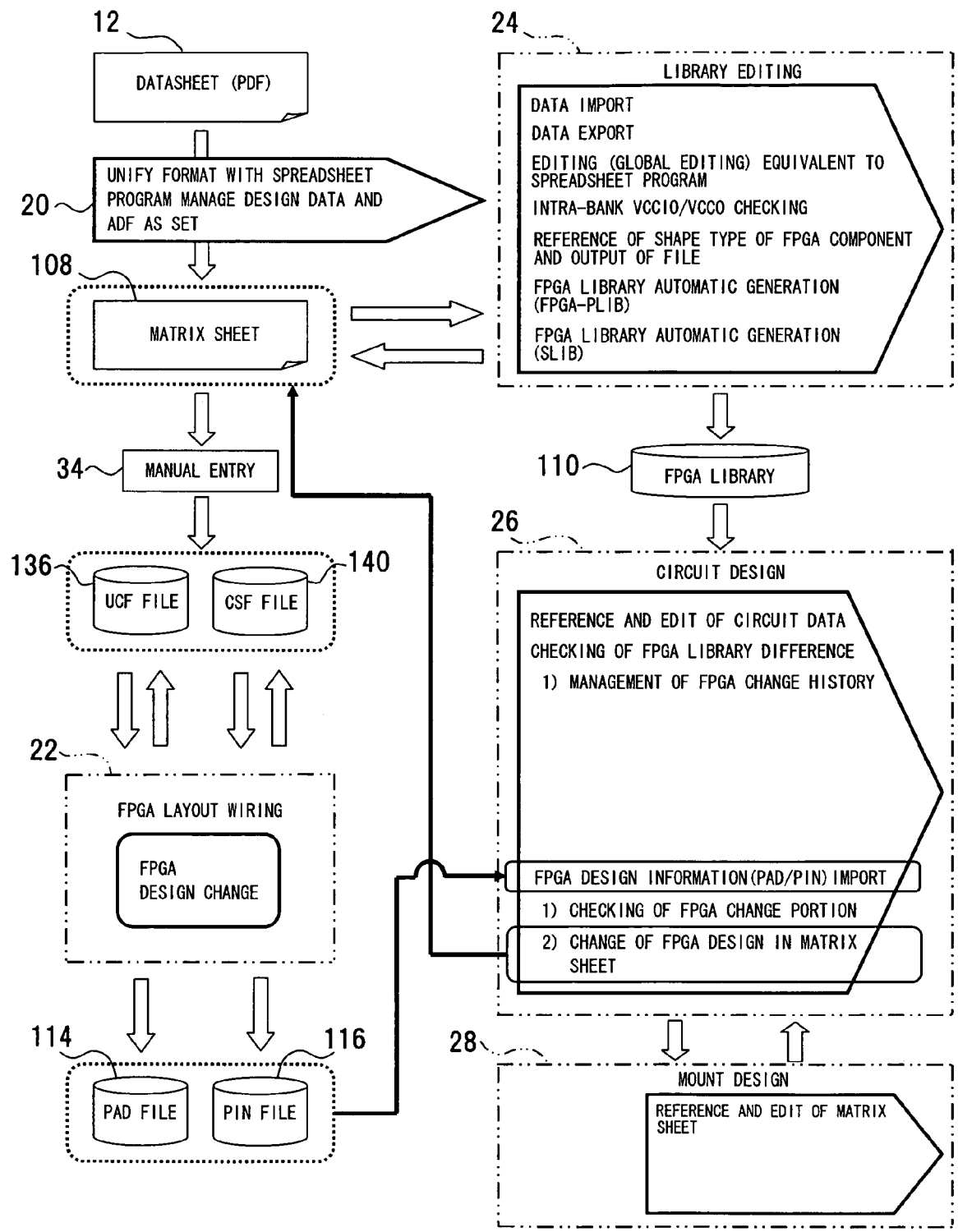
FIG. 19 is a diagram showing a system configuration for processing for changing the FPGA design.

As described above, for the FPGA design support apparatus 2, a system configuration as shown in FIG. 16 is used for the new-design processing, a system configuration as shown in FIG. 17 is used for the FPGA-library change processing, a system as shown in FIG. 18 is used for FPGA-pin-layout change processing, and a system configuration as shown in FIG. 19 is used for the FPGA-design change processing. In this manner, functions of the FPGA layout wiring program 122, the library edit program 124, the circuit design program 126, and the mount design program 128, in the FPGA design support program 102, which are executed by the FPGA design support apparatus 2, correspond to the respective types of processing.

Figure 20:
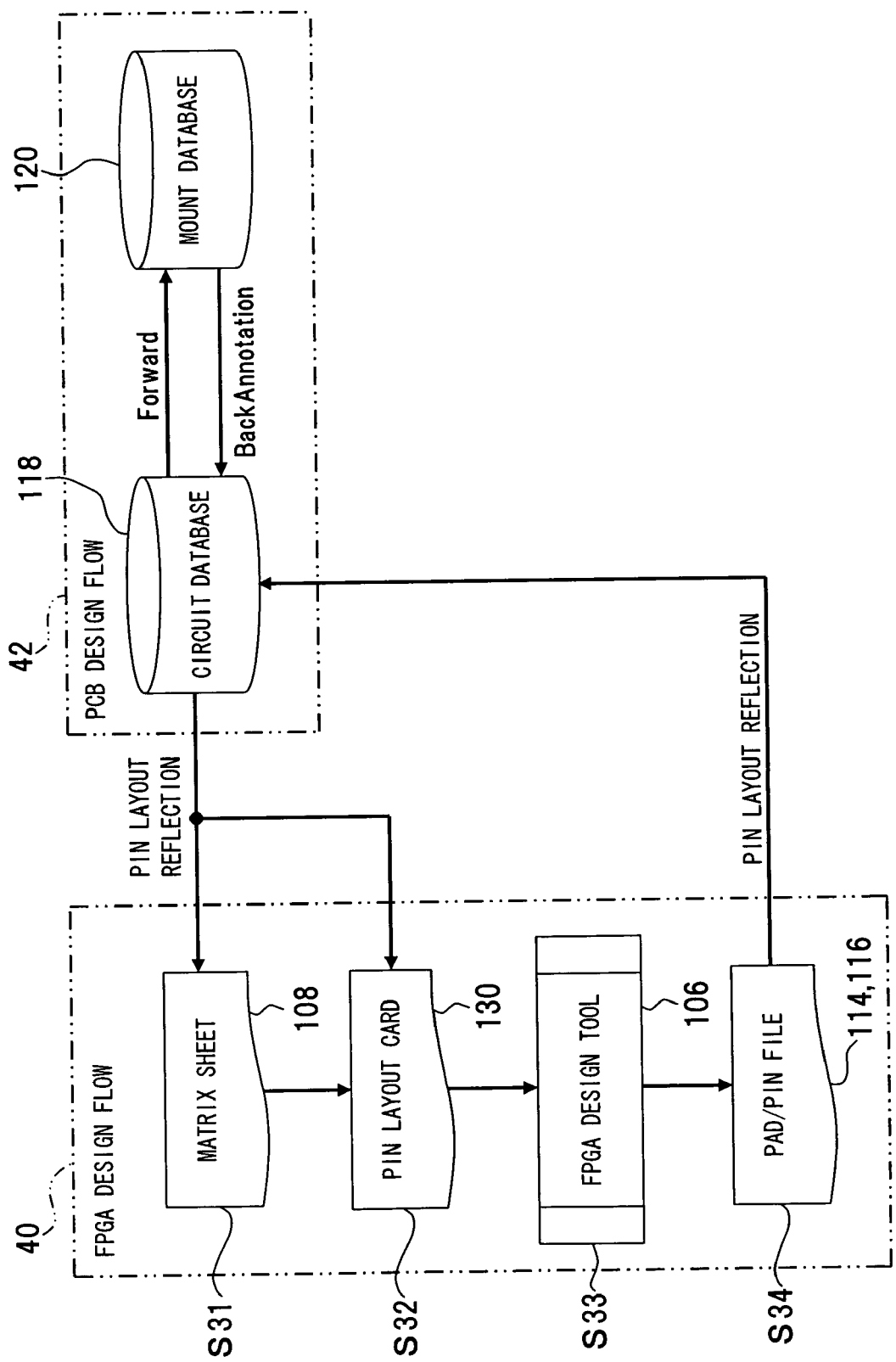
FIG. 20 is a diagram showing coordination between an FPGA design tool and the FPGA design support apparatus.

Next, the coordinated processing of the FPGA design tool 106 and the FPGA design support program 102 will be described with reference to FIG. 20. FIG. 20 shows processes for automatically reflecting a change in the pin layout information between FPGA design and PCB design.

In this processing, an FPGA design flow 40 and a PCB design flow 42 are processed in coordination. In the FPGA design flow 40, in step S31, the matrix sheet 108 that contains pin layout information is generated. Next, in step S32, the PIN layout card 130 of the tool control card 112 created. In step S33, the PIN layout card 130 is incorporated into the FPGA design tool 106. Next, in step S34, the PAD file 114 and the PIN file 116 are formed. The pin layout information of the PAD file 114 and the PIN file 116 are reflected in the circuit database 118 in the PCB design flow 42.

In the PCB design flow 42, the circuit database 118 and the mount database 120 executes data transfer (forward annotation/back annotation) therebetween. In this case, the pin layout information is reflected from the circuit database 118 into the matrix sheet 108 and the PIN layout card 130 in the FPGA design flow 40. The pin layout information is reflected from the PAD file 114 and the PIN file 116 into the circuit database 118, so that the information is updated to common pin layout information.

In this manner, interface change information, such as pin layout information, is communicated between different types of CAD tools, so that the design information is standardized. Such processing accomplishes processing for changing an FPGA interface between different CAD tools in coordination.

Figure 21:
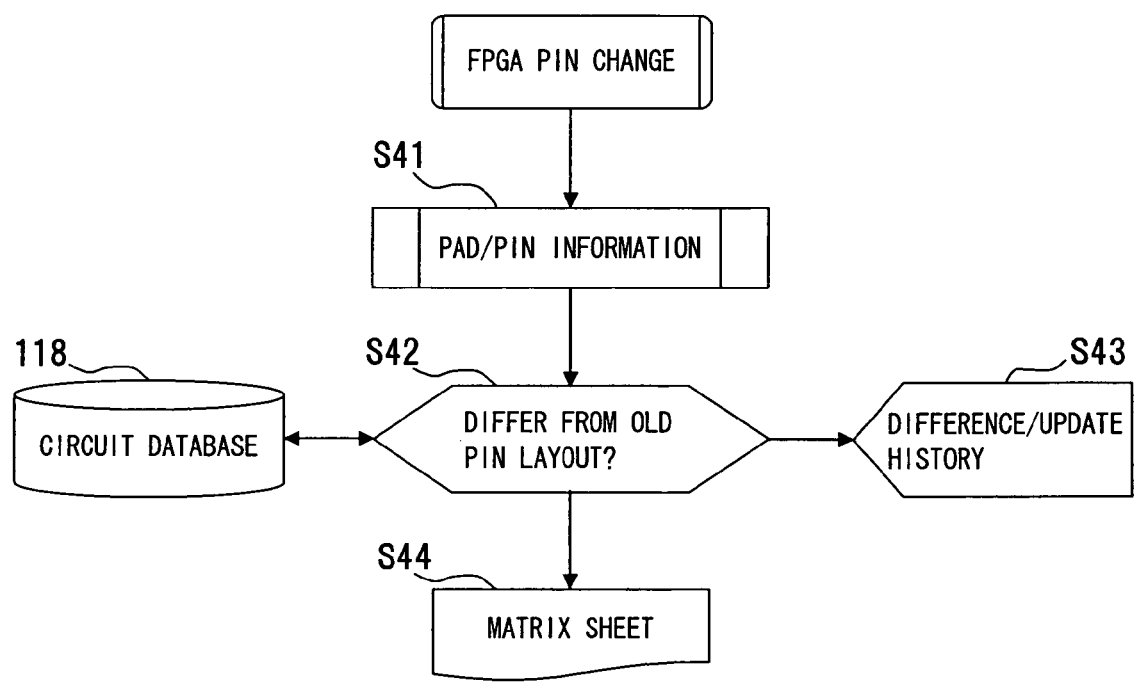
FIG. 21 is a flow chart showing FPGA-pin change processing.

Next, changing pin layout information will be described with reference to FIG. 21. FIG. 21 shows processing for changing FPGA pin layout information from an FPGA design flow to a PCB design flow.

In this processing, when the pin layout at the FPGA is changed, in step S41, for example, PAD/PIN information (shown in FIG. 22) obtained by the FPGA layout wiring program 122 is output. In step S42, the PAD/PIN information is compared with pin layout information in the circuit database 118. When there is a difference therebetween, in step S43, the pin layout table in the circuit database 118 is changed. Also, in step S43, the resulting information is output as difference/update history. In this case, the difference/update history is recorded and displayed. In step S44, the difference/update history is output to the matrix sheet 108, which is a pin information file, so that the pin information is fed back to the FPGA.

Figure 23:
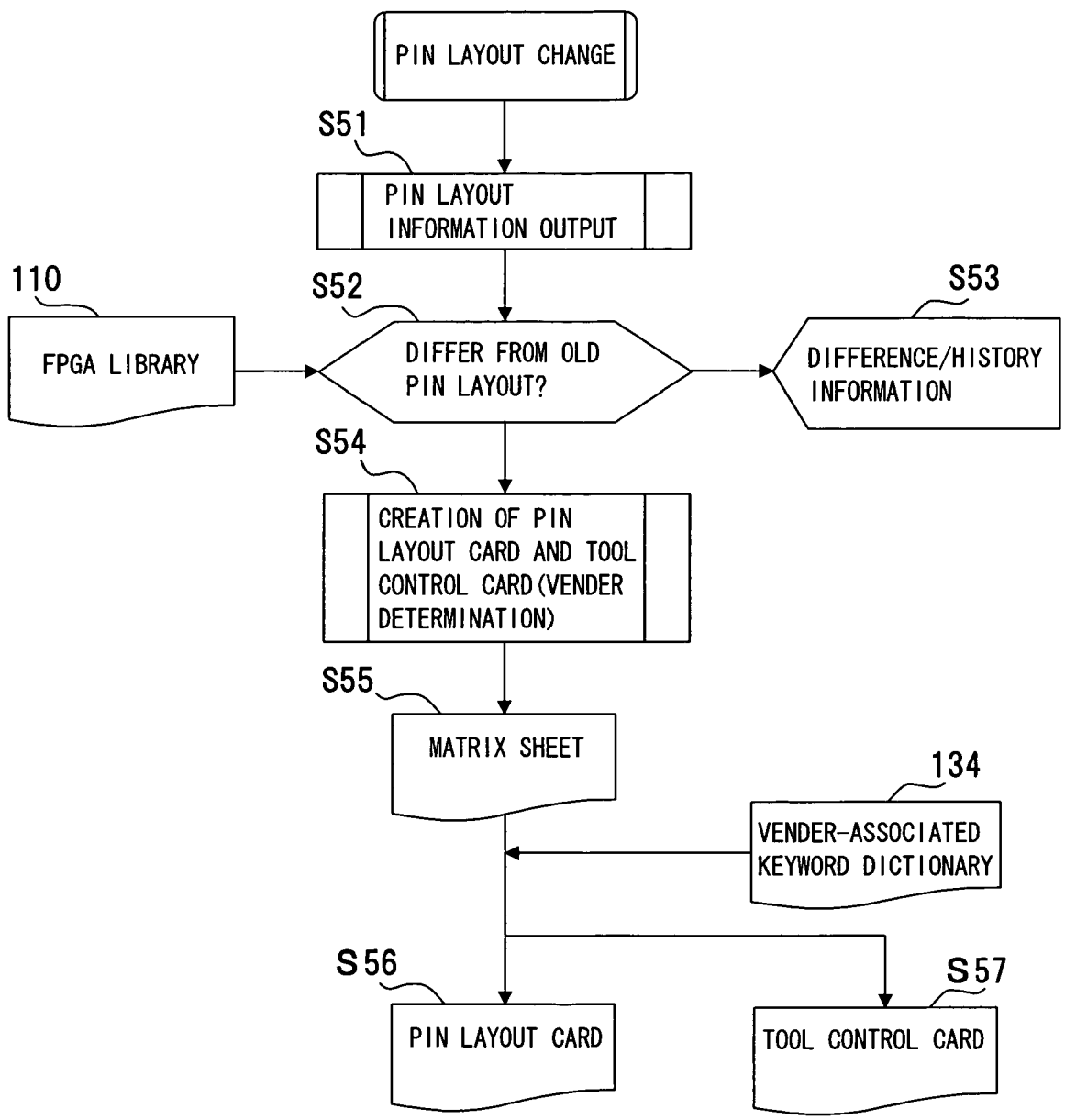
FIG. 23 is a flow chart showing processing for changing the pin layout.

Next, changing PCB-side pin layout will be described with reference to FIG. 23. FIG. 23 shows processing for changing FPGA pin layout information from a PCB design flow to an FPGA design flow.

In this processing, when the pin layout at the PCB is changed, the pin layout information is output (in text) in step S51. In step S52, the pin layout is compared with old pin layout. When the comparison indicates a difference therebetween, in step S53, the difference is output as difference/update history information. In step S54, the PIN layout card 130 and the tool control card 112 are created. In this case, the formats are unified. In step S55, the pin layout information is temporarily included in the matrix sheet 108, which is pin information file having a common format. In steps S56 and S57, the PIN layout card 130 and the tool control card 112 which are compliant with each vender are created from the matrix sheet 108. In the creation of the cards, since each card has a different keyword in the file for each FPGA vender, the vender-associated keyword dictionary 134 (FIG. 10) is referred to and the cards are translated and converted into data (e.g., FIG. 24) corresponding to each vender. In this case, the pin layout information having the format unified by the spread sheet program 104 used in the FPGA design support program 102 is re-converted into a format corresponding to each vender and thus can be used for the FPGA design tool 106 of the vender.

Features of the above-described embodiments and modifications will now be described.

1) Although the FPGA design support apparatus, the FPGA design support method, and the FPGA design support program have been described, byway of example, as the integrated-circuit design support apparatus, the integrated-circuit design support method, and the integrated-circuit design support program are disclosed and described in the above described embodiments, the present invention is not limited to the FPGA illustrated in the embodiment and is thus applicable to a wide variety of integrated circuits.

2) As described in the above embodiment, with respect to design of an integrated circuit, the design support environment can be improved because of an enhancing data management an increased efficiency in creation of the integrated-circuit design library, a reduced design work hours resulting from the feedback function, an improved efficiency in the quality of design data, and so on.

3) In currently available circuit design in which FPGA products are mainly designed, large-scale FPGAs are increasingly used as alternatives to conventional ASICs. Thus, the use of the FPGA design support apparatus 2, the FPGA design support program 102, and so on can reduce lead-time mistakes and design load due to the large number of pins.

4) Since the formats of pin layout materials can be unified and design data can be linked, the efficiency of data management and the quality of data are improved.

5) The use of the FPGA design support apparatus 2, the FPGA design support program 102, and so on can present a model format to improve the history management function.

6) The use of the FPGA design support apparatus 2, the FPGA design support program 102, and so on can provide a library creation function using design information from the FPGA design tool 106 supplied from a vender and can achieve coordination with logic design.

7) The use of the FPGA design support apparatus 2, the FPGA design support program 102, and so on can improve the function for providing the FPGA design with design information. That is, the information swap function is extended, the feedback function for changed data is provided, and a format output (FIG. 23) for the FPGA design tool 106 is obtained.

8) Since the design becomes efficient, work hours for the FPGA logic design, the pin layout change, and the board design can be significantly reduced.

9) With respect to the matrix sheet 108, data-sheet formats, which have been dependent on designers, can be unified. Further, management by each designer can be facilitated and checking of coherence with various types of design data can be facilitated.

10) With respect to the FPGA library 110, registration checking, editing, generation, and so on of the library are facilitated. Checking coherence between FPGA design constraint conditions and the library is facilitated. Further facilitated processing includes checking coherence between the pin layout information and the library; checking a change portion during FPGA pin layout change; automatically changing associated information during the FPGA pin layout change; automatically changing associated information during FPGA design change; and checking FPGA-design change history, on-bare-chip pin layout information in FPGA design, and bus wiring of logic net information.

11) With respect to design of an FPGA, which is one example of integrated circuits, efficiency in data management and library creation are improved, the feedback function is improved, the quality of design data is improved, efficiency in the design is improved, design work is reduced, design time is reduced, the design support environment is improved, and the design quality is improved.

12) According to a recording medium of the present invention, the integrated circuit design support program stored therein is executed by a computer, so that supplied pin layout information can be unified in a common format to form a pin layout matrix. The resulting information is highly versatile and editing, such as changing, of the information is possible. The information is utilized as basic information for circuit design and mount design to improve efficiency in the design.

Although the most preferred embodiments of the present invention have been described hereinabove, it is to be appreciated that the present invention is not limited to the above description and that various changes and modifications will naturally occur to those skilled in the art based on the spirit of the invention described in the appended claims or disclosed herein. Moreover, needless to say, such changes and modifications are encompassed in the scope of the present invention.

The entire disclosure of Japanese Patent Application No. 2004-264282 including specification, claims, drawings, and summary are incorporated herein by reference by its entirety.

What is claimed is:

1. An integrated-circuit design support apparatus that supports designing of an integrated circuit having a plurality of pins, the apparatus comprising:
   a processor that forms a pin layout matrix by unifying pin layout information of the integrated circuit using a common format and arranging the pin layout information in coordinates; wherein
   the coordinates of the pin layout matrix are composed of a plurality of cells, and a pin attribute of the integrated circuit is written in each of the cells; and
   the common format is generated before forming the pin layout matrix.

2. The integrated-circuit design support apparatus according to claim 1, wherein the processor creates an integrated-circuit design library from the pin layout matrix.

3. The integrated-circuit design support apparatus according to claim 2, wherein the processor compares the pin layout information in the integrated circuit design with pin layout information contained in the integrated-circuit design library and outputs a result of the comparison.

4. The integrated-circuit design support apparatus according to claim 2, wherein the processor compares pin layout information in circuit design or mount design of the integrated circuit with pin layout information contained in the integrated-circuit design library and changes the pin layout information of one or both of the pin layout matrix and the integrated-circuit design library in accordance with a result of the comparison.

5. The integrated-circuit design support apparatus according to claim 2, wherein change history of the pin layout information is stored in a storage section and the change history is referred to for the circuit design or the mount design of the integrated circuit.

6. The integrated-circuit design support apparatus according to claim 5, further comprising a display section that displays the change history.

7. An integrated-circuit design support method that supports designing of a integrated circuit having a plurality of pins, the method comprising:
   forming a pin layout matrix unified by a common format by arranging pin layout information of the integrated circuit in coordinates, the formed pin layout matrix being used to support designing of an integrated circuit having a plurality of pins; wherein
   the coordinates of the pin layout matrix are composed of a plurality of cells, and a pin attribute of the integrated circuit is written in each of the cells; and
   the common format is generated before forming the pin layout matrix.

8. An integrated-circuit design support method that supports designing of an integrated circuit having a plurality of pins, the method comprising:
   creating a pin layout matrix by arranging pin layout information of the integrated circuit in coordinates and unifying the pin layout information using a common format, and
   generating an integrated-circuit design library from the pin layout information expressed in the pin layout matrix; wherein
   the coordinates of the pin layout matrix are composed of a plurality of cells, and a pin attribute of the integrated circuit is written in each of the cells; and
   the common format is generated before forming the pin layout matrix.

9. The integrated-circuit design support method according to claim 8, further comprising comparing the pin layout information in the integrated circuit design with pin layout information contained in the integrated-circuit design library and outputting a result of the comparison.

10. The integrated-circuit design support method according to claim 8, further comprising comparing pin layout information in circuit design or mount design of the integrated circuit with pin layout information contained in the integrated-circuit design library, and changing the pin layout information of one or both of the pin layout matrix and the integrated-circuit design library in accordance with a result of the comparison.

11. The integrated-circuit design support method according to claim 8, further comprising storing change history of the pin layout information into a storage section and referring to the change history for the circuit design or the mount design of the integrated circuit.

12. The integrated-circuit design support method according to claim 11, further comprising displaying the change history.

13. An integrated-circuit design support program that is executed by a computer to support designing of an integrated circuit having a plurality of pins, the program comprising:
   a step of creating a pin layout matrix by arranging pin layout information of the integrated circuit in coordinates and unifying the pin layout information using a common format,
   wherein the program causes the computer to execute the step so as to support designing of the integrated circuit; wherein
   the coordinates of the pin layout matrix are composed of a plurality of cells, and a pin attribute of the integrated circuit is written in each of the cells; and
   the common format is generated before forming the pin layout matrix.

14. An integrated-circuit design support program that is executed by a computer to support designing of an integrated circuit having a plurality of pins, the program comprising:

a step of creating a pin layout matrix by arranging pin layout information of the integrated circuit in coordinates and unifying the pin layout information using a common format, and a step of generating an integrated-circuit design library from the pin layout information expressed in the pin layout matrix, wherein the program causes the computer to execute the steps so as to support designing of the integrated circuit; wherein the coordinates of the pin layout matrix are composed of a plurality of cells, and a pin attribute of the integrated circuit is written in each of the cells; and the common format is generated before forming the pin layout matrix.

15. A computer-readable recording medium that stores an integrated-circuit design support program to be executed by a computer, the program comprising:

a step of creating a pin layout matrix by arranging pin layout information of the integrated circuit having a plurality of pins in coordinates and unifying the pin layout information using a common format; wherein the coordinates of the pin layout matrix are composed of a plurality of cells, and a pin attribute of the integrated circuit is written in each of the cells; and the common format is generated before forming the pin layout matrix.

16. A computer-readable recording medium that stores an integrated-circuit design support program to be executed by a computer, the program comprising:

a step of creating a pin layout matrix by arranging pin layout information of the integrated circuit having a plurality of pins in coordinates and unifying the pin layout information using a common format, and a step of generating an integrated circuit design library from the pin layout information expressed in the pin layout matrix; wherein the coordinates of the pin layout matrix are composed of a plurality of cells, and a pin attribute of the integrated circuit is written in each of the cells; and the common format is generated before forming the pin layout matrix.

* * * * *